United States Patent
Hasegawa et al.

(10) Patent No.: US 10,027,256 B2
(45) Date of Patent: Jul. 17, 2018

(54) VIBRATION POWER GENERATION DEVICE

(71) Applicants: SUMITOMO RIKO COMPANY LIMITED, Komaki-shi, Aichi (JP); PANASONIC INTELLECTUAL PROPERTY MANAGEMENT CO., LTD., Osaka-shi, Osaka (JP)

(72) Inventors: Koichi Hasegawa, Kasugai (JP); Hajime Kurikuma, Komaki (JP); Takahiro Kachi, Ichinomiya (JP); Takeshi Nomura, Komaki (JP); Hidenori Katsumura, Hyogo (JP); Hiroshi Kagata, Osaka (JP); Masaya Tamura, Osaka (JP)

(73) Assignees: SUMITOMO RIKO COMPANY LIMITED, Komaki (JP); PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 313 days.

(21) Appl. No.: 14/947,479

(22) Filed: Nov. 20, 2015

(65) Prior Publication Data

US 2016/0079886 A1 Mar. 17, 2016

Related U.S. Application Data

(63) Continuation of application No. PCT/JP2014/082794, filed on Dec. 11, 2014.

(30) Foreign Application Priority Data

| Dec. 13, 2013 | (JP) | 2013-258446 |
| Dec. 13, 2013 | (JP) | 2013-258447 |
| Dec. 24, 2013 | (JP) | 2013-265216 |

(51) Int. Cl.
*H02N 2/18* (2006.01)
*H01L 41/113* (2006.01)
(Continued)

(52) U.S. Cl.
CPC ............... *H02N 2/188* (2013.01); *B60Q 1/26* (2013.01); *H01L 41/1136* (2013.01);
(Continued)

(58) Field of Classification Search
CPC .. H02N 2/188; H01L 41/1136; H01L 41/1134
(Continued)

(56) References Cited

U.S. PATENT DOCUMENTS

2007/0145861 A1* 6/2007 Tanner .................... A45F 3/08
310/339
2009/0211353 A1 8/2009 Gao et al.
(Continued)

FOREIGN PATENT DOCUMENTS

| CN | 101615652 A | 12/2009 |
| CN | 102677846 A | 9/2012 |

(Continued)

OTHER PUBLICATIONS

Apr. 24, 2017 Office Action issued in Chinese Patent Application No. 201480063053.6.
(Continued)

*Primary Examiner* — Bryan Gordon
(74) *Attorney, Agent, or Firm* — Oliff PLC

(57) ABSTRACT

A vibration power generation device including a multiple-degree-of-freedom vibration system comprising a first vibration system and a second vibration system, wherein a natural frequency of the first vibration system is different from a natural frequency of the second vibration system. A first mass member of the first vibration system has a hollow structure including a housing space inside, where the second
(Continued)

vibration system is housed. A power generating element is mounted on a plate spring of the second vibration system. A support part projects within the housing space, and one end side of the plate spring is attached to the support part and supported within the housing space at a position inward from a peripheral wall of the first mass member. A second mass member of the second vibration system is attached to another end side of the plate spring.

25 Claims, 19 Drawing Sheets

(51) Int. Cl.
  *H02K 35/00*    (2006.01)
  *B60Q 1/26*     (2006.01)
  *H05B 37/02*    (2006.01)
  *B60Q 1/28*     (2006.01)
  *B60Q 1/30*     (2006.01)
(52) U.S. Cl.
  CPC ............ *H02K 35/00* (2013.01); *H02N 2/181* (2013.01); *H05B 37/02* (2013.01); *B60Q 1/2657* (2013.01); *B60Q 1/2665* (2013.01); *B60Q 1/28* (2013.01); *B60Q 1/30* (2013.01)
(58) Field of Classification Search
  USPC ........................................ 310/339, 328, 330
  See application file for complete search history.

(56) References Cited

U.S. PATENT DOCUMENTS

| 2010/0106428 | A1* | 4/2010 | Anderson | G01B 7/14 |
| | | | | 702/33 |
| 2011/0140578 | A1* | 6/2011 | Ko | B60C 23/0411 |
| | | | | 310/339 |
| 2011/0204752 | A1* | 8/2011 | Gao | H02N 2/183 |
| | | | | 310/339 |
| 2013/0062999 | A1 | 3/2013 | Muker-Uz-Zaman et al. | |
| 2013/0320807 | A1 | 12/2013 | Sakaguchi et al. | |
| 2015/0145375 | A1* | 5/2015 | Sakaguchi | H01L 41/1136 |
| | | | | 310/321 |
| 2015/0295520 | A1* | 10/2015 | Hasegawa | H01L 41/1136 |
| | | | | 310/323.01 |

FOREIGN PATENT DOCUMENTS

| CN | 103036478 A | 4/2013 |
| CN | 103166503 A | 6/2013 |
| JP | H08-104170 A | 4/1996 |
| JP | 2005-067365 A | 3/2005 |
| JP | 4290690 B2 | 7/2009 |
| JP | 2009-254163 A | 10/2009 |
| JP | 2011-152004 A | 8/2011 |
| JP | 4862286 B2 | 1/2012 |
| JP | 2013-010416 A | 1/2013 |
| JP | 2013-147161 A | 8/2013 |
| KR | 2013-0010760 A | 1/2013 |
| WO | 2012/137695 A1 | 10/2012 |
| WO | 2013/024848 A1 | 2/2013 |

OTHER PUBLICATIONS

Dec. 14, 2016 Office Action issued in Japanese Patent Application No. 2015-532989.
Jun. 23, 2016 International Preliminary Report on Patentability issued in International Application No. PCT/JP2014/082794.
Mar. 3, 2015 Search Report issued in International Patent Application No. PCT/JP2014/082794.
May 24, 2016 Office Action issued in Japanese Patent Application No. 2015-532989.
Dec. 13, 2017 Office Action issued in Chinese Patent Application No. 201480063053.6.

* cited by examiner

VIBRATION POWER GENERATION DEVICE

INCORPORATED BY REFERENCE

The disclosures of Japanese Patent Application Nos. 2013-258446 filed on Dec. 13, 2013, 2013-258447 filed on Dec. 13, 2013 and 2013-265216 filed on Dec. 24, 2013, each including the specification, drawings and abstract is incorporated herein by reference in its entirety. This is a Continuation of International Application No. PCT/JP2014/082794 filed on Dec. 11, 2014.

BACKGROUND OF THE INVENTION

1. Field of the Invention

The present invention relates to a vibration power generation device that converts vibration energy of a vibrating member to electrical energy using a power generating element, and to a sensor device, a vehicle-use light emitting device, and a building-use light emitting device using the same.

2. Description of the Related Art

Conventionally, devices including sensor devices, vehicle-use light emitting devices, building-use light emitting devices or the like that detect various types of physical amount need to be supplied electric power required for their operation from an external power supply such as a battery, commercial power, or the like through a power feeder.

Incidentally, the sensor devices include a pressure sensor for seat or the like as disclosed in Japanese Unexamined Patent Publication No. JP-A-2013-147161. Further, for automobiles, for example, there are not a few cases where the number of sensors mounted thereon exceeds 100, including various types of mechanical sensors, electromagnetic sensors, temperature sensors, optical sensors, and chemical sensors. Also, the vehicle-use light emitting devices include a corner pole and a side mirror light as respectively disclosed in Japanese Unexamined Patent Publication No. JP-A-2005-067365 and Japanese Unexamined Patent Publication No. JP-A-8-104170, or the like, many of which are to be mounted onto members constituting the end of the vehicle in particular. Moreover, the building-use light emitting devices include a light emitting device or the like that illuminates a stairway of a house, as disclosed in Japanese Patent No. JP-B-4290690.

However, with the sensor device or the light emitting device for automobiles for example, since the number of the sensor devices is significant, and many light emitting devices are mounted on near the end of the vehicle body, and so on, arranging the power feeder from the battery may lead to increase in weight due to a great deal of total extension of the power feeder, making it difficult to avoid an adverse effect on mileage or traveling performance. Meanwhile, with the building-use light emitting device, since it is general to emit a light using commercial power, the device may become useless during power outage. Especially during the disaster, there was a problem that the stairway and the corridor used as an evacuation passage are not illuminated, making it difficult to ensure safety.

It would be conceivable to utilize a small built-in battery such as a button battery, a power generation device using a solar panel, or a rotary power generation device disclosed in Japanese Unexamined Patent Publication No. JP-A-2009-254163. Also, as described in JP-B-4290690 mentioned above, it would be conceivable to generate electric power by deforming a flexible step tread by weight of the walker acting thereon, and applying the deformation of the step tread to a piezoelectric element.

However, the small built-in battery has the problem of cumbersome in maintenance because the battery needs to be frequently changed, and the solar panel has the problem that equipment involving storage batteries and a control device may become large-scale and risk of damage may also be significant. In addition, since the use of the rotary power generation device described in JP-A-2009-254163 is limited to high-speed rotating parts such as connecting rods of an internal combustion engine in the first place, range of uses therefor may be narrow, posing a problem of difficulty in use. Furthermore, the use of the power generation device using the step tread disclosed in JP-B-4290690 is limited to the walking region of buildings, and in addition to that, the tread of the walking region is made flexible, thereby giving discomfort to walking sense. Additionally, degree of freedom in designing may be considerably restricted, posing a problem of an adverse effect on the design of the building.

Accordingly, to handle the high demand for energy saving in recent times, in Japanese Unexamined Patent Publication No. JP-A-2011-152004, power generation devices have been proposed that convert vibration energy to electrical energy. However, with the power generation device described in JP-A-2011-152004, the piezoelectric vibrating body is a one-degree-of-freedom vibration system for which the mass member is elastically supported by the spring member, so for vibration input of a frequency that is off from the natural frequency of the vibration system, there is the risk of not being able to generate sufficient deformation of the spring member, and not being able to effectively obtain power.

Meanwhile, U.S. Publication No. US 2013/0320807 discloses a vibration power generation device including a base member disposed above a vibrating member while extending in the horizontal direction, a spring elastically supporting the base member, and a power generating element extending on the base member in the horizontal direction while being capable of bending and vibrating in the vertical direction, wherein the power generating element is supported by the base member. Besides, International Publication No. WO 2013/024848 discloses a vibration power generation device including a retaining frame to be attached to a vibrating body, a support frame of rectangular frame shape elastically supported by the retaining frame, a vibration plate projecting inward from the peripheral wall of the support frame, and a power generating element mounted onto the vibration plate. Employing such vibration power generation devices makes it possible to reduce or obviate power supply from the outside.

However, both of the vibration power generation devices disclosed in these US 2013/0320807 and WO 2013/024848 may suffer from the problem of finding it still difficult to stably and efficiently realize desired power generation at the time of vibration input.

Extensive review and the tests by the inventors have shown a newly notified problem that it is difficult to stabilize the state of deformation of the power generating element caused by vibration input. Specifically, for the power generating element or the piezoelectric element, the direction of vibration that contributes to power generation is determined. On the other hand, the direction of vibration of the base member or the retaining frame elastically supported by the vibrating member is difficult to be determined. Therefore, when the base member or the retaining frame vibrates in the direction that does not contribute to power generation due to vibration input from the outside, a variety of vibration deformations such as oscillation (pitching), torsion, prizing or the like will arise in the power generating element or the piezoelectric element. Consequently, their vibration deformation becomes unstable, posing a problem of difficulty in stably obtaining desired power generation effect.

SUMMARY OF THE INVENTION

The present invention has been developed in view of the above-described matters as the background, and it is an object of the present invention to provide a vibration power generation device with a novel structure which is able to stably realize highly efficient power generation with respect to vibration input over a wide frequency range, as well as to provide a sensor device, a vehicle-use light emitting device, and a building-use light emitting device using the same.

Specifically, a first mode of the present invention related to a vibration power generation device provides a vibration power generation device comprising: a power generating element configured to be attached to a vibrating member to convert vibration energy of the vibrating member to electrical energy; and a multiple-degree-of-freedom vibration system comprising a first vibration system in which a first mass member is elastically supported by a first spring member, and a second vibration system in which a second mass member is elastically connected to the first mass member by a second spring member, wherein the power generating element is arranged between the first mass member and the second mass member, and relative displacement of the first mass member and the second mass member is caused with vibration being applied from the vibrating member to the first mass member and transmitted to the second mass member so that the vibration energy of the vibrating member is input to the power generating element, a natural frequency of the first vibration system is different from a natural frequency of the second vibration system, the first mass member has a hollow structure provided with a housing space inside, and the second vibration system is housed within the housing space, the second spring member of the second vibration system is formed of a plate spring, and the power generating element is mounted on the plate spring, a support part projects within the housing space of the first mass member, one end side of the plate spring is attached to the support part and supported within the housing space at a position inward from a peripheral wall of the first mass member, and the second mass member is attached to another end side of the plate spring.

With the vibration power generation device constructed according to the present mode, first, the first mass member has a hollow structure in which its entire circumference is surrounded by the peripheral wall. With this structure, the center of gravity of the first mass member can be efficiently set inward from the outer circumference surface of the peripheral wall, thereby achieving stabilization of vibration state and ease of design of the first vibration system. In addition, by arranging the second vibration system within the housing space formed inside the first mass member, the peripheral wall of the first mass member readily attains dust proofing and waterproof functions for the arrangement area of the second vibration system. This will prevent influence of disturbance, thereby stabilizing vibration state of the second vibration system as well.

Moreover, the plate spring that constitutes the spring member of the second vibration system is supported by the support part projecting from the peripheral wall of the first mass member at the position inward from the peripheral wall within the housing space. With this arrangement, it is possible to obtain a large vibration magnification by the low damping capacity of the plate spring, thereby improving power generating efficiency. Besides, vibrations in the direction effective for power generation will be stably input from the first vibration system to the second vibration system during vibration transmission, so as to enhance power generating efficiency. Specifically, the support part of the plate spring is positioned inward from the peripheral wall of the first mass member within the housing space.

Accordingly, vibration in the direction of bounce (vertical direction) whose amplitude becomes large at the center side of the first mass member, and which effectively causes bending deformation of the plate spring and contributes to power generation of the power generating element, can be efficiently transmitted as vibration input from the first mass member to the first vibration system through the support part. Meanwhile, transmission of component in the direction of vibration whose amplitude becomes large at the outer circumference of the first mass member, such as pitching (oscillation), torsion, prizing or the like of the first mass member will be minimized. As a result, irregular deformation of the plate spring will be inhibited, making it possible to more stably realize power generation action by the power generating element due to desired vibration deformation of the plate spring in the bending direction.

As the power generating element mounted on the plate spring, a piezoelectric element, a magnetostrictive element or the like which can convert a mechanical physical amount of plate spring distortion, deformation, stress or the like to energy can be suitably used. Also, as the plate spring, a metal spring such as spring steel or the like can be suitably used, but it is also possible to use a resin spring or the like according to the conditions, and it is possible to do complementary addition of the desired damping capacity by coating the surface with rubber.

With the vibration power generation device of this mode, with a plurality of mutually different natural frequencies, sufficient volume of the relative displacement of the first mass member and the second mass member is ensured to be large by the resonance phenomenon, and it is possible to efficiently obtain a power generation volume of the power generating element obtained according to the volume of the relative displacement of the first mass member and the second mass member.

In fact, by arranging the power generating element between the first and second mass members of the multiple-degree-of-freedom vibration system, during vibration input of a frequency range for which the first mass member and the second mass member are relatively displaced in the reverse phase, even with an input vibration of a frequency that is off from the natural frequency of the vibration system, it is possible to ensure a large volume of the relative displacement of the first mass member and the second mass member. Therefore, it is possible to obtain sufficient power generation volume of the power generating element in relation to vibration input of a broad frequency range, and possible to effectively obtain power.

Here, relative displacement means the vibration of the vibrating member being applied to the first mass member via the first spring member, the first mass member itself vibrating, that vibration then further being transmitted to the second mass member via the second spring member, and the second mass member being displaced in relation to the first mass member.

In this way, with the power generation device of this mode, not only with vibration input of a frequency that matches the mechanical natural frequency of the vibration system, but also with vibration input for a frequency range that is off from the natural frequency, effective power generation is realized, and it is possible to efficiently convert vibration energy to electrical energy.

A second mode of the present invention related to the vibration power generation device provides the one according to the first mode, wherein a center of gravity of the first mass member is set within the housing space.

With the vibration power generation device of this mode, the center of gravity of the first mass member is set within the housing space where the support base is disposed, and can be set more close to the support point of the plate spring, namely the spring member of the second vibration system. By so doing, with the first mass member, vibration component such as pitching (oscillation), torsion, prizing or the like can be more effectively inhibited from being transmitted to the second vibration system, thereby further improving decrease of irregular deformation and vibration of the plate spring as well as the attendant stabilization of power generation action by the power generating element.

A third mode of the present invention related to the vibration power generation device provides the one according to the first or second mode, wherein the natural frequency of the second vibration system is set to a lower frequency in relation to the natural frequency of the first vibration system.

With the vibration power generation device of the third mode, the natural frequency of the second vibration system is set to a low frequency in relation to the natural frequency of the first vibration system, so the spring constant of the second spring member is set to be small, it is easier to ensure sufficient volume of the relative displacement of the second mass member in relation to the first mass member, and it is easy to further improve the power generating efficiency corresponding to the volume of the relative displacement of the first mass member and the second mass member. With a lower frequency range than the antiresonance frequency with the two-degree-of-freedom vibration system, displacement is done in the same phase in relation to the input vibration for both the first mass member and the second mass member, so the energy of the input vibration is efficiently applied to the first and second vibration systems, and it is possible to realize effective power generation.

A fourth mode of the present invention related to the vibration power generation device provides the one according to any one of the first through third modes, wherein the natural frequency of the first vibration system is set to a higher frequency than an electrical antiresonance frequency of the second vibration system.

With the fourth mode, with a higher frequency range than the electrical antiresonance frequency for which a drop in power generating efficiency easily becomes a problem with a one-degree-of-freedom vibration system power generation device, there is an improvement in power generating efficiency based on the resonance or the like at the secondary natural frequency of the vibration system, and it is possible to realize effective power generation on the vibration input of broader frequency ranges.

A fifth mode of the present invention related to the vibration power generation device provides the one according to any one of the first through fourth modes, wherein the natural frequency of the first vibration system is $\sqrt{2}$ times or less in relation to the natural frequency of the second vibration system.

With the fifth mode, by the vibration of the first vibration system and the vibration of the second vibration system being mutually transmitted and being in a combined vibration state, it is possible to mutually complement and maintain a vibrating state of the first vibration system and the second vibration system across a broad frequency range, and possible to efficiently realize power generation.

A sixth mode of the present invention related to the vibration power generation device provides the one according to any one of the first through fifth modes, wherein a resonance response magnification of the second vibration system is made larger than a resonance response magnification of the first vibration system, and a product of a mass of the first mass member and the resonance response magnification of the first vibration system is larger than a product of a mass of the second mass member and the resonance response magnification of the second vibration system.

With the sixth mode, by the resonance response magnification of the second vibration system being made to be larger than the resonance response magnification of the first vibration system, a large amplitude of the second mass member is ensured during vibration input, and efficient power generation is realized with the power generating element arranged in the second vibration system. Also, the offset vibration damping action that acts between the first vibration system and the second vibration system is inhibited, and vibrating states of the first vibration system and the second vibration system are stably ensured, so that effective power generation is realized for wide band vibration.

A seventh mode of the present invention related to the vibration power generation device provides the one according to any one of the first through sixth modes, further comprising a stopper that restricts the relative displacement of the second mass member in relation to the first mass member.

With the seventh mode, excessive relative displacement of the first mass member and the second mass member is prevented by the stopper, the input to the power generating element is restricted, and damage or the like to the power generating element is prevented.

An eighth mode of the present invention related to the vibration power generation device provides the one according to any one of the first through seventh modes, wherein the first spring member is formed of a rubber elastic body.

With the eighth mode, the first spring member is formed using a rubber elastic body having damping performance, so that sufficient volume of the relative displacement of the first mass member and the second mass member is ensured for input of a wider frequency range, and effective power generation is realized.

A ninth mode of the present invention related to the vibration power generation device provides the one according to any one of the first through eighth modes, wherein the device is configured to be mounted on a site of the vibrating member by which vibrations of multiple types whose vibration levels become maximum within mutually different frequency ranges are applied to the multiple-degree-of-freedom vibration system.

With the ninth mode, by applying the power generation device of the constitution according to the present invention using a multiple-degree-of-freedom vibration system to a specific vibrating member having a vibration peak at a plurality of different frequency ranges, it is possible to obtain stable power generating efficiency under diverse situations. As the vibrating member to which this mode is applied, examples include an electric washing machine for which the vibration frequency differs according to the laundry weight or the like, an automobile for which the vibration frequency differs according to the travel state or the like, for example.

A tenth mode of the present invention related to the vibration power generation device provides the one according to any one of the first through ninth modes, wherein a mass of the first mass member is 10% or greater of an equivalent mass of the vibrating member.

With the tenth mode, the first vibration system functions as a dynamic damper that offsets and reduces the vibration of the vibrating member, and it is possible to obtain effective vibration damping action.

An eleventh mode of the present invention related to the vibration power generation device provides the one according to any one of the first through tenth modes, further comprising a transmitter that transmits an output state of the power generating element to an outside.

With the eleventh mode, it is possible not only to monitor the output state of the vibration power generation device from the outside, for example, a remote location, or the like, but also to see vibration state etc. of the vibrating body or the like to which the vibration power generation device is mounted by the output state of the vibration power generation device.

A twelfth mode of the present invention related to the vibration power generation device provides the one according to the eleventh mode, wherein the transmitter comprises a wireless transmission device, and the output state of the power generating element is configured to be wirelessly transmitted to the outside by the wireless transmission device being operated using electric power obtained by input of vibration energy into the power generating element.

With the twelfth mode, no wiring of a power feed cable or a signal transmission cable is required between the device and the outside in transmitting the output state of the power generating element. This makes it possible to simplify the structure of the device and facilitate installation operation of the device. In addition, conditions for installation of the vibration power generation device will be ameliorated, thereby increasing sites to which the device can be suitably mounted.

A first mode of the present invention related to a sensor device provides a sensor device comprising: a sensing element; and a vibration power generation device according to any one of the first through twelfth modes of the present invention related to a vibration power generation device, wherein electric power obtained by the vibration power generation device is configured to be self-supplied.

The sensor device of construction according to the present mode was made considering the problem that with the sensor device of the aforementioned conventional construction, a great deal of total extension of the power feeder may lead to increase in weight or the like. Specifically, first, the inventors discussed on putting a power generation device utilizing generated vibration into practical use in order to decrease the number of wirings of lead wires for power feeding or output required by the sensor device mounted onto a vehicle such as an automobile or the like, for example. This is because if the sensor device includes a power generation device, for example, by self-supplying the power supply for sensing, or by wirelessly transmitting the detection signals, or the like, it is possible to obviate wirings of the lead wires for power feeding and/or output.

However, vibrations in an automobile or the like, for example, are exerted by a power unit including an internal combustion engine, or wheels. Accordingly, depending on driving condition or the like, input vibrations are different, vibration frequencies change over a wide range, and input directions of vibration are also varied, thus it cannot be expected that vibrations only in a specific direction will be input. On the other hand, vibration power generation devices typically include a resonance system tuned to a specific frequency range, and are configured to perform power generation by making use of resonance action of the resonance system, as well as to exhibit effective power generation performance with respect to vibrations in a specific direction. Therefore, even if a vibration power generation device is mounted on the vehicle, for example, it was difficult to obtain sufficient power generating efficiency, making it hard to expect stable operation.

Under such conditions, as a result of further research by the inventors, the above-described invention according to the first mode of the present invention related to a sensor device was completed. With the sensor device according to the present mode, since the device itself includes a power generation device, when electric power is required for its operation, power supply from the outside is not necessary. This makes it possible to obviate or reduce lead wires for power feeding, thereby minimizing increase in weight due to placement of many lead wires. In particular, by employing the vibration power generation device as the power generation device, it is possible to efficiently obtain the required electrical energy from the vibration energy for those having a vibration source such as a power unit including an internal combustion engine or an electric motor device, or those which are subject to vibration input from the outside, for example, vehicles such as automobiles or the like, machine tools, home appliances, bridges, and a pillar or a floor of buildings or the like.

In particular, the present mode employs the first and second vibration systems of the specific structure in which the first mass member has a hollow structure, and the support part projecting from the peripheral wall of the first mass member supports the plate spring of the second vibration system. With this arrangement, it is possible to obtain a large vibration magnification by the low damping capacity of the plate spring, thereby improving power generating efficiency. Besides, vibrations in the direction effective for power generation will be stably input from the first vibration system to the second vibration system, so as to enhance and stabilize power generating efficiency. In particular, vehicles such as automobiles or the like are subjected to vibrations in various directions depending on driving condition or the like. Nevertheless, even under the state where a variety of vibrations are input, regarding vibrations transmitted to the second vibration system having the power generating element, vibration transmissions in the direction advantageous to power generation are efficiently maintained while reducing vibration transmissions in the other directions. Vibration power generation action of the second vibration system will be stabilized thereby.

In addition, the present mode employs the vibration power generation device having the specific structure in which two vibration systems are combined and natural frequencies of the respective vibration systems are different from each other. This makes it possible to obtain good power generating efficiency, namely, conversion efficiency from vibration energy to electrical energy over a wide frequency range. In particular, for vehicles such as automobiles or the like, changes in generated vibration frequency are inevitable depending on number of rotations of the power unit, driving speed, and so forth. Here, under such special vibration state, by employing the vibration power generation device of the above-described specific structure including two vibration systems in combination, it is possible to obtain stable electric power, so as to effectively supply electric power required for the sensor device and realize stable sensor operation. Note that with the sensor device according to the present invention, it is not necessary to supply operating power for the device, light emission, or alarm only by the self-supplied electric power. It would also be acceptable to self-supply power as an auxiliary electric power.

A second mode of the present invention related to the sensor device provides the one according to the first mode related to the sensor device, wherein the vibration power generation device is used as an operation power supply for sensing by the sensing element.

According to the sensor device of the present mode, wiring of lead wires from a separate power supply or the like for supplying electric power to the sensing element for sensing operation is not necessary, or can be minimized, thereby reducing weight for the weight of the power feed lead wire.

A third mode of the present invention related to the sensor device provides the one according to the second or first mode related to the sensor device, further comprising a wireless transmission device that transmits a detection signal from the sensing element, wherein the vibration power generation device is used as an operation power supply for the wireless transmission device.

According to the sensor device of the present mode, lead wires for outputting the detection signals from the sensing element to the outside are not necessary, or can be reduced. Thus, particularly with the sensor device mounted onto remote locations, increase in weight due to sensor output lead wire will be effectively avoided. Besides, the present mode is also effective in the case where the sensor device is mounted onto the locations such as rotating parts, which are difficult to wire.

A fourth mode of the present invention related to the sensor device provides the one according to any one of the first through third modes related to the sensor device, further comprising a signal processing device that processes a detection signal from the sensing element, wherein the vibration power generation device is used as an operation power supply for the signal processing device.

According to the sensor device of the present mode, in the case where the device includes the signal processing device that performs amplification, filtering, correction or the like on the detection signals from the sensing element, it is also possible to obviate or minimize wiring for obtaining operation power supply for the signal processing device. The present mode can also be applied to a smart sensor or the like in which intelligence is placed by providing a microcontroller to the sensor device.

A fifth mode of the present invention related to the sensor device provides the one according to any one of the first through fourth modes related to the sensor device, wherein the sensing element comprises the power generating element.

According to the sensor device of the present mode, by making use of the power generating element as the sensing element, a simple structure can be achieved, and a signal processing system can also be simplified.

A sixth mode of the present invention related to the sensor device provides the one according to any one of the first through fifth modes related to the sensor device, further comprising a warning device that gives an alarm depending on power generation condition of the vibration power generation device.

According to the sensor device of the present mode, in the case where the sensor device is mounted onto a vehicle for example, characteristics in which vibration condition of the vibrating member changes depending on the travel condition of the vehicle can be appropriately utilized. Namely, it is possible to see the travel condition of the vehicle based on the power generation condition of the vibration power generation device that changes depending on the vibration condition of the vibrating member, and to give a perceivable alarm such as a light, a sound, and so forth according to the travel condition. Therefore, for example, catching abrupt acceleration, abrupt deceleration or the like from the power generation condition depending on a specific vibration condition makes it possible to efficiently assist driving by warning that the travel state is not economical or ecologically-friendly by means of the power generating element according to the present invention.

A first mode of the present invention related to a vehicle-use light emitting device provides a vehicle-use light emitting device that is provided to a vehicle member constituting an end of a vehicle, comprising: an emitter to emit a light through power supply; and a vibration power generation device according to any one of the first through twelfth modes of the present invention related to a vibration power generation device, wherein electric power obtained by the vibration power generation device is configured to be self-supplied.

The vehicle-use light emitting device of construction according to the present mode was made in view of the problem from which the vehicle-use light emitting device of the aforementioned conventional construction may suffer. Specifically, consider a case in which electric power is supplied to an emitter (light source) such as LEDs or the like of the light emitting device provided to the component that constitutes the end of a vehicle such as an automobile or a two-wheeled vehicle, namely, a bumper, a door mirror, a fender, a luggage carrier or the like. If the electric power is supplied from a battery etc. arranged in the engine compartment or the like via power feed wiring such as a wiring harness, the length of the wiring harness for supplying electric power becomes large, thereby inevitably causing increase in weight.

Here, with the vehicle-use light emitting device of construction according to the present mode, light emission of the emitter provided to the end of the vehicle makes it possible to let others know the existence of the vehicle or the vehicle width. Moreover, since the operation power supply is the vibration power generation device, the operation power supply can be disposed close to the emitter, thereby making the wiring harness shorter. Besides, electric power required for light emission will be effectively obtained or supplemented by vibration during driving, whereby the necessity of a battery change or charging can be obviated or reduced. In particular, by obviating or minimizing the wiring harness that supplies electric power for light emission operation, it is possible to decrease or eliminate the disconnection problem of the wiring harness at the end of the vehicle where vibration is likely to become especially large.

Furthermore, vibrations in an automobile or the like are exerted by a power unit including an internal combustion engine, or wheels. Accordingly, depending on driving condition or the like, input vibrations are different, vibration frequencies change over a wide range, and input directions of vibration are also varied, thus it cannot be expected that vibrations only in a specific direction will be input. Here, the vehicle-use light emitting device of construction according to the present mode employs the vibration power generation device including the first and second vibration systems of the specific structure in which the first mass member has a hollow structure, and the support part projecting from the peripheral wall of the first mass member supports the plate spring of the second vibration system. With this structure, even under the above-described condition, power generating efficiency can be improved and stabilized, and hence stable light emission will be realized.

A second mode of the present invention related to the vehicle-use light emitting device provides the one according to the first mode related to the vehicle-use light emitting device, wherein the vehicle member comprises an automotive member constituting an end of an automobile serving as the vehicle, and the emitter comprises at least one of a corner pole, a door mirror light and a bumper light.

According to the vehicle-use light emitting device of the present mode, it is possible to permit the corner pole, the door mirror light, or the bumper light to emit a light by utilizing vibration of the automobile during driving. In particular, since the emitter is provided to the bumper or the door mirror that constitutes the end of the automobile, input vibration to the vibration power generation device will be advantageously obtained, thereby realizing efficient vibration power generation.

A third mode of the present invention related to the vehicle-use light emitting device provides the one according to the first mode related to the vehicle-use light emitting device, wherein the vehicle member comprises a two-wheeled-vehicle member constituting an end of a two-wheeled vehicle serving as the vehicle, and the emitter comprises at least one of an end cap light of handlebars, a rear position light at a back of a seat, a front position light of a front fork, and a mirror light.

According to the vehicle-use light emitting device of the present mode, it is possible to permit an end cap light of handlebars, a rear position light at a back of a seat, a front position light of a front fork, and a mirror light by utilizing vibration of a two-wheeled vehicle, especially a motorcycle during driving. In particular, by applying this mode to a two-wheeled vehicle whose vibration is likely to become larger than that of an automobile, vibration power generation will be advantageously realized.

A fourth mode of the present invention related to the vehicle-use light emitting device provides the one according to any one of the first through third modes related to the vehicle-use light emitting device, wherein the vibrating member is a separate component attached to a main frame of the vehicle.

According to the vehicle-use light emitting device of the present mode, the vehicle-use light emitting device is provided not to the main frame, which is aimed at vibration reduction in order to improve ride comfort, but to the component separated from the main frame. Accordingly, vibration energy will be effectively input to the vibration power generation device, thereby enhancing power generating efficiency. Moreover, even in the case where the vibrating member undergoes displacement relative to the main frame, wiring of the wiring harness that straddles the vibrating member and the main frame is not necessary, and the wiring harness is made short, so that troubles such as disconnection or the like will be avoided.

A first mode of the present invention related to a building-use light emitting device provides a building-use light emitting device comprising: an emitter that lightens a walking region of a building; and a vibration power generation device according to any one of the first through twelfth modes of the present invention related to a vibration power generation device, wherein a vibration damper is constituted by the first vibration system in which the first mass member is elastically supported by the first spring member with respect to a floor of the walking region of the building, and electric power obtained by the vibration power generation device is configured to be self-supplied.

The building-use light emitting device of construction according to the present mode was made considering the fact that with the building-use lighting source of the aforementioned conventional construction, the lighting source at the time of power outage is insufficient because it uses commercial power, and the storage battery or the solar battery has a problem of capacity shortage or large-scale equipment. Besides, the device of the present mode also has an object to provide a building-use light emitting device of novel structure that is capable of reducing or eliminating discomfort to walking sense or limitations in design and structure which can be a problem to the lightening device by making the step tread itself flexible so as to generate power.

With the building-use light emitting device constructed according to the present mode, it is possible to perform private power generation by utilizing vibrations applied to the tread due to walking, and to allow the emitter to emit a light by using the electric power so as to illuminate the walking region. Especially in the present mode, one of the features is to employ a vibration damper which is mounted onto the floor of the walking region such as the floor board, the step tread, or the like and suppresses its vibration, and to constitute the vibration power generation device by utilizing the vibration damper.

Specifically, the floor undergoes vibration deformation due to the impact during walking, for example, walking vibration at the floor surface on the second floor in the household may cause quake or generation of noises at the ceiling of the first floor. The inventors focused on such vibration phenomenon, and by converting vibration energy which can be a problem to electrical energy which can be effectively used and utilizing it, they were able to successfully address both the problem of walking vibration and the subject of obtaining sufficient lighting source. Specifically, by providing the vibration damper comprising the first vibration system to the floor of the walking region, it is possible to minimize vibration and noises of the floor. Meanwhile, under the state where the vibration and noises of the floor are effectively reduced, large vibration is induced in the first vibration system. Accordingly, large vibration energy is exerted on the vibration power generation device, thereby efficiently generating power.

Moreover, with the building-use light emitting device of the present mode, a plurality of vibration systems are provided in series on the floor which serves as the vibrating member. Thus, the second vibration system is oscillated via the first vibration system which is oscillated by the input vibration from the floor. Besides, since the natural frequencies of the first vibration system and the second vibration system are set different from each other, with a plurality of mutually different natural frequencies, sufficient volume of the relative displacement of the first mass member and the second mass member is ensured to be large by the resonance phenomenon. Therefore, it is possible to efficiently obtain a power generation volume of the power generating element obtained according to the volume of the relative displacement of the first mass member and the second mass member.

In addition, by arranging the power generating element between the first and second mass members of the multiple-degree-of-freedom vibration system, during vibration input of a frequency range for which the first mass member and the second mass member are relatively displaced in the reverse phase, even with an input vibration of a frequency that is off from the natural frequency of the vibration system, it is possible to ensure a large volume of the relative displacement of the first mass member and the second mass member. Therefore, it is possible to obtain sufficient power generation volume of the power generating element in relation to vibration input of a broad frequency range.

In this way, with the power generation device of this mode, not only with vibration input of a frequency that matches the mechanical natural frequency of the vibration system, but also with vibration input for a frequency range that is off from the natural frequency, effective power generation is realized, and it is possible to efficiently convert vibration energy to electrical energy. Moreover, vibrations applied from the floor are different depending on various conditions including the environment such as temperature or humidity, the carried load of furniture or people, the state of fixtures, the walking position, or the walking speed, so as to change their vibration frequency or the direction of vibration. Here, the building-use light emitting device of construction according to the present mode employs the vibration power generation device including the first and second vibration systems of the specific structure in which the first mass member has a hollow structure, and the support part projecting from the peripheral wall of the first mass member supports the plate spring of the second vibration system. With this structure, even under the above-described condition, power generating efficiency can be improved and stabilized, and hence stable light emission will be realized.

A second mode of the present invention related to the building-use light emitting device provides the one according to the first mode related to the building-use light emitting device, wherein the walking region of the building is set to at least one of a stairway and a corridor.

According to the building-use light emitting device of the present mode, even during the disaster, for example, sufficient lighting source of the evacuation route for people can be obtained, thereby ensuring safety. It could be acceptable to utilize the self-supplied electric power as an auxiliary electric power in combination with commercial power or the like. However, when obtaining the lighting source during the disaster, it is desirable to realize light emission operation only by the self-supplied electric power.

A third mode of the present invention related to the building-use light emitting device provides the one according to the first or second mode related to the building-use light emitting device, wherein the walking region of the building comprises a plurality of areas, and electrical circuits are provided separately to the areas, the electrical circuits each turning on the emitter using electric power obtained by the power generating element provided to the multiple-degree-of-freedom vibration system.

According to the building-use light emitting device of the present mode, even when malfunction occurs to a single area regarding the power generation system, the power supply system, the light emission system or the like, lighting source of the other areas can be sufficiently ensured, thereby enhancing safety of the overall walking region of the building.

A fourth mode of the present invention related to the building-use light emitting device provides the one according to any one of the first through third modes related to the building-use light emitting device, further comprising a sound device, wherein the sound device is configured to ring using electric power obtained by input of vibration energy into the power generating element.

According to the building-use light emitting device of the present mode, since the light and the sound are emitted due to walking on the walking region, it is possible for an elderly person or the like with impaired vision to easily recognize the walking region. Note that the warning sound of the sound device may be anything including music, alarm, messages, or the like. Whereas it is desirable that all electric power required for ringing the sound device be supplied by the generated power from the power generating element, it would also be acceptable to supply the electric power in combination with other electric power such as a storage battery or the like.

Furthermore, with the building-use light emitting device according to any one of the first through fourth modes related to the building-use light emitting device, there is another preferable mode that is combined with the vibration power generation device according to the eleventh or twelfth mode related to the vibration power generation device, wherein the output state of the power generating element of the building-use light emitting device is transmitted to the outside. With this mode, for example, it is possible to recognize in remote locations from the building that vibration is input to the power generating element. Thus, the device can be utilized as the one for grasping the state of occurrence of an earthquake in the building site, or as a security alarm transmitter in the building, and the like. In particular, by employing the twelfth mode related to the vibration power generation device, external power supply can be obviated when transmitting the power generation condition of the power generating element to the outside. Thus, the device can be operated even when the power supply of the building is out of working order due to, for example, the disaster, disconnection, or the like.

According to the present invention, with the vibration power generation device of specific structure, the power generating element is arranged between the first mass member and the second mass member that constitute the multiple-degree-of-freedom vibration system, and power can be obtained with the power generating element according to the volume of the relative displacement of the first mass member and the second mass member. Therefore, it is possible to obtain power by the power generating element for vibration input of a plurality of mutually different frequencies, and efficient power generation is realized by the power generating element for vibration input of a broad frequency range for which the first mass member and the second mass member are displaced in the reverse phase.

In particular, even under the condition where the vibrations applied to the vibration power generation device have various frequencies and are input in various directions, by employing the vibration power generation device including the first and second vibration systems of the specific structure in which the first mass member has a hollow structure, and the support part projecting from the peripheral wall of the first mass member supports the plate spring of the second vibration system, power generating efficiency can be improved and stabilized.

Besides, according to the sensor device, the vehicle-use light emitting device, and the building-use light emitting device comprising the vibration power generation device of the specific structure related to the present invention, by appropriately utilizing the electric power which is efficiently and stably generated by the vibration power generation device, the power feeder or the like required for the device can be removed or reduced. Consequently, installation of the device or the like becomes easy, and it is possible to improve durability of the device, broaden the application area of the device, and the like.

BRIEF DESCRIPTION OF THE DRAWINGS

The foregoing and/or other objects, features and advantages of the invention will become more apparent from the following description of a preferred embodiment with reference to the accompanying drawings in which like reference numerals designate like elements and wherein.

DETAILED DESCRIPTION OF PREFERRED EMBODIMENTS

Figure 1:
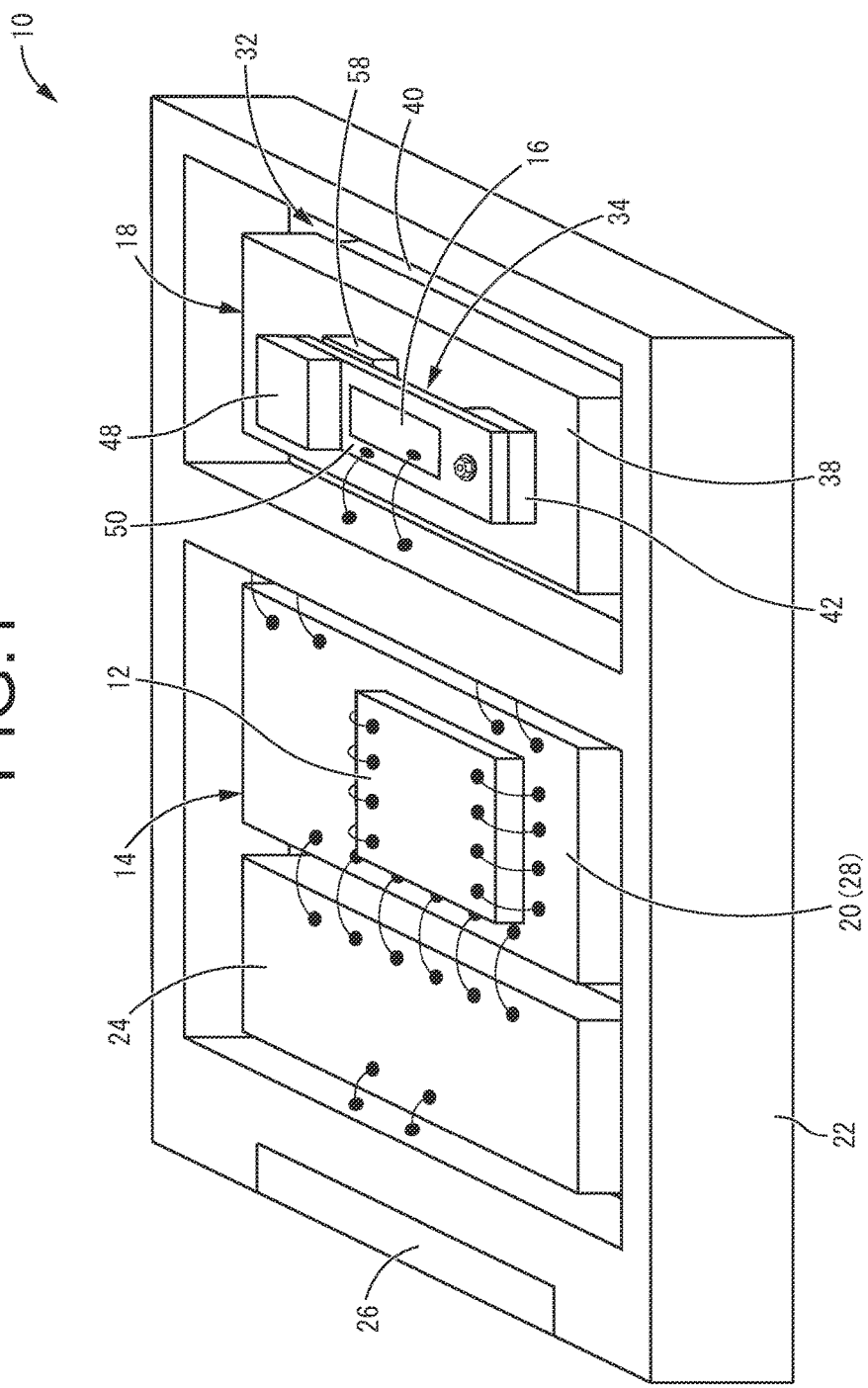
FIG. 1 is a perspective view showing a simplified structure of a sensor device including a vibration power generation device as a first embodiment of the present invention.

Embodiments of the present invention will be described below in reference to the drawings. Referring first to FIG. 1, there is depicted a simplified structure of a sensor device 10 as a first embodiment of the present invention including a vibration power generation device constructed according to the present invention. Specifically, the sensor device 10 includes, in addition to a sensor portion 14 having a sensing element 12, a vibration power generation device 18 having a power generating element 16 constructed according to the present invention. In this embodiment in particular, the sensor device 10 is a vehicle-use sensor device to be attached to a vehicle such as an automobile or the like, and is configured to be attached to a vehicle body serving as a vibrating member. The sensor portion 14 detects and outputs physical amounts such as temperatures, accelerations, or the like at the site where the sensor device 10 is attached, by using electric power generated by the vibration power generation device 18.

Described more specifically, the sensor portion 14 includes the sensing element 12 that detects desired prescribed physical amounts and a measuring circuit unit 20 serving as a signal processing device that processes detection signals obtained by the sensing element 12.

The sensing element 12 can detect physical amounts to be detected as electrical signals, and is suitably selected from those conventionally known depending on the sites where the sensor device 10 is attached, the physical amounts to be detected, or the like. For example, as a mechanical sensor for detecting quantities of motion or mechanical quantities, a piezoelectric element, a piezo element, a magnetoresistive element, or the like are employable. As an electromagnetic sensor for detecting electromagnetic quantities, a semiconductor magnetic sensor element or the like utilizing electromagnetic pickup, Hall effect, etc. are employable. As a temperature sensor for detecting temperatures, temperature sensing elements or the like of contact type using thermistor or bimetal, as well as noncontact type using pyroelectric effect or infrared are both employable. As an optical sensor for detecting lights, a semiconductor optical sensor element, a photo diode or the like are employable. As an electrochemical sensor for detecting quantities of chemical change, an oxygen sensing element using a solid electrolyte element, a semiconductor device detecting changes in electrical conductivity according to an atmosphere or the like are employable.

Note that FIG. 1 illustrates one construction example in which the sensing element 12 is housed in a case 22, whose opening is to be covered and sealed or the like by a lid (not shown). However, the construction of the case 22 or the arrangement mode of the sensing element 12 may be appropriately changed according to the sensing element 12 employed, and the sensing element 12 need not be housed in the case 22. For example, if the sensing element 12 is an exhaust gas sensor, it is mounted inside an exhaust pipe to be exposed to exhaust gas and reference gas.

Then, the detection signal detected by the sensing element 12 as an electrical signal corresponding to the physical amount to be measured is configured to be input to the measuring circuit unit 20. The measuring circuit unit 20 electrically processes the detection signal so as to generate a signal including accessible information. As a specific example, employed as needed are: an A/D converter that converts the detection signal, which is an analog signal, into a digital signal for easy processing; an amplifier that amplifies the detection signal; a filter that removes unnecessary signals; a compensator that executes arithmetic operation processing on an inaccurate signal due to loss or noises through interpolation or the least squares method for compensation; and a processing unit that converts the detection signal into functions or the like which are easy to access, or the like. In preferred practice, such a measuring circuit unit 20 for processing detection signals comprises a single or a plurality of IC packages.

In addition, the measuring circuit unit 20 may also include a memory means for storing the processed detection signals up to a prescribed amount or for a prescribed time period.

The detection signals obtained by the sensing element 12 are processed in the measuring circuit unit 20, and then output to the outside so as to be transmitted to the device requiring the detection signals, for example, an external device such as an ECU in the present embodiment.

Here, the sensor device 10 according to the present embodiment includes a wireless transmission unit 24 serving as a wireless transmission device. The processed detection signals are configured to be wirelessly transmitted from the wireless transmission unit 24 via a transmitting antenna 26. Specifically, the wireless transmission unit 24 generates a carrier wave, namely a carrier, as well as modulates it and performs signal processing so that the detection signals are converted and carried by the carrier wave as information. While it is possible to use a circuit of analog modulation such as amplitude modulation or angle modulation, in preferred practice, by using a circuit of digital modulation or pulse modulation and performing signal processing for carrying the detection signals as digital information, interference between a multitude of sensor signals can be avoided.

The external device requiring the detection signals also includes a wireless receiving unit that performs signal processing corresponding to that of the wireless transmission unit 24, so that the detection signals are to be taken out by demodulating the signals received by the wireless receiving unit via the receiving antenna.

Incidentally, the sensor portion 14 requires operating power for detecting physical amounts as well as processing and transmission of the detection signals. Namely, drive power supply for a semiconductor circuit that performs signal processing is required in order to process the detection signals, while electric power is required for the wireless transmission unit 24 in order to generate and modulate the carrier wave. Besides, the sensing element 12, in case of a capacitance type sensor or an infrared temperature sensor, requires operating power for sensing.

Figure 2:
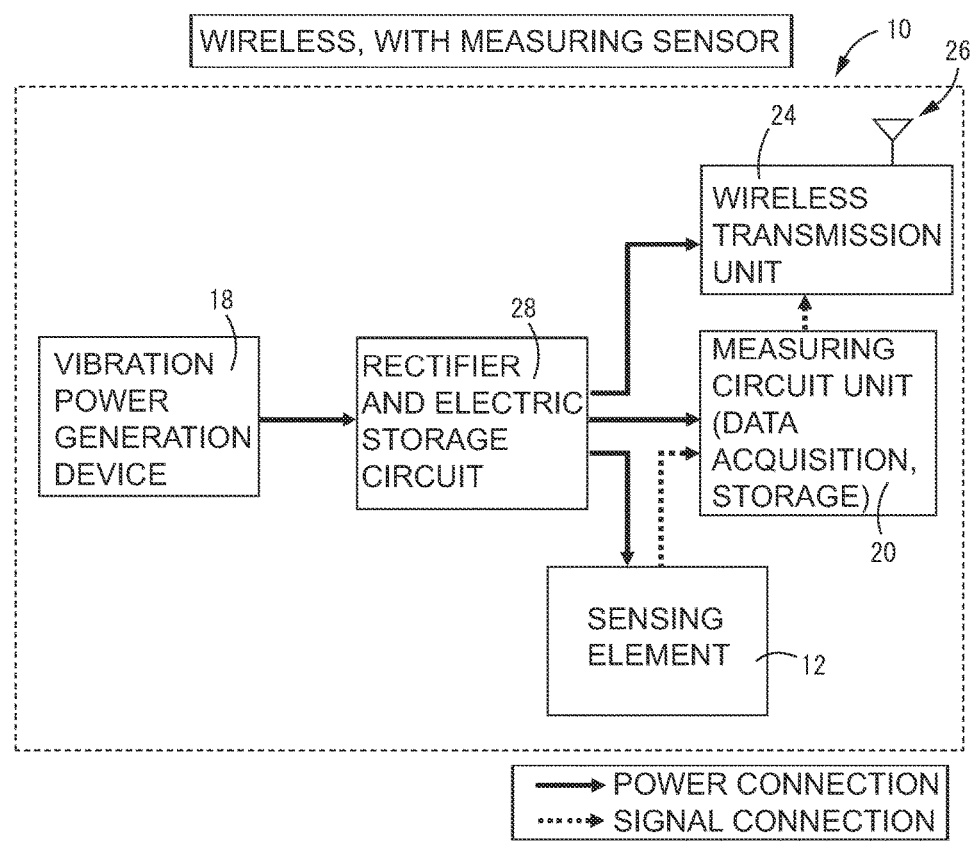
FIG. 2 is a functional block diagram suitable for explaining the sensor device shown in FIG. 1.

Here, in the sensor device 10 according to the present embodiment, the operation power supply for these comprises the vibration power generation device 18, which is also one embodiment of the present invention as described above, and operating power is configured to be provided and self-supplied. Specifically, as depicted in FIG. 2, the vibration power generation device 18 converts vibration energy of the vibrating member into electrical energy, and a rectifier and electric storage circuit 28 converts the obtained voltage into DC power, which is configured to be supplied to the sensing element 12, the measuring circuit unit 20, and the wireless transmission unit 24 as operating power. The rectifier and electric storage circuit 28 includes, for example, a rectifier circuit using a diode etc. and a power storage circuit using a capacitor etc., and can stably supply the output voltage from the vibration power generation device 18 as operating power for a prescribed time period. In addition, the rectifier and electric storage circuit 28 may include a secondary battery with a large capacity as needed. Besides, in FIG. 2, the solid line indicates the transmission path of the electric power created by electrical connection to the vibration power generation device 18, which is the drive power supply, while the dashed line indicates the transmission path of the detection signals transmitted from the sensing element 12 to the wireless transmission unit 24 via the measuring circuit unit 20.

Accordingly, the operating power for the sensor device including the sensing element 12, the measuring circuit unit 20, and the wireless transmission unit 24 is covered by the electric power generated by the vibration power generation device 18. Thus, in the sensor device 10 of the present embodiment, no wiring of lead wires is required for supplying power to the sensor device 10 from a battery or the like. This makes it possible to considerably improve degree of freedom in setting the installation position of the sensor device 10 and to avoid increase in weight of the vehicle due to the wiring, thereby achieving enhancement in fuel consumption rate during driving, improvement in driving stability, or the like.

Moreover, the sensor device 10 of the present embodiment includes the wireless transmission unit 24 for wirelessly transmitting detection signals to outside. Thus, no lead wire is required for output of the detection signals, thereby minimizing increase in weight of the vehicle due to installation of the sensor device even more effectively.

In particular, we will describe in detail hereafter the vibration power generation device 18 having a specific construction according to the present invention, which includes a plurality of vibration systems. There is a case where this vibration power generation device 18 is mounted on and used for the vibrating member of an automobile for which the vibration frequency differs over a wide range according to the travel condition or the like, namely, which is subjected to vibrations of multiple types whose vibration levels become maximum within mutually different frequency ranges. Even in such a case, the vibration power generation device 18 is able to generate stable electric power and supply it to the sensor portion 14. This makes it possible for the sensor device 10 according to the present embodiment to realize stable sensing operation and wireless signal transmission operation without requiring any lead wire for power supply from or signal output to outside with high reliability.

Figure 3:
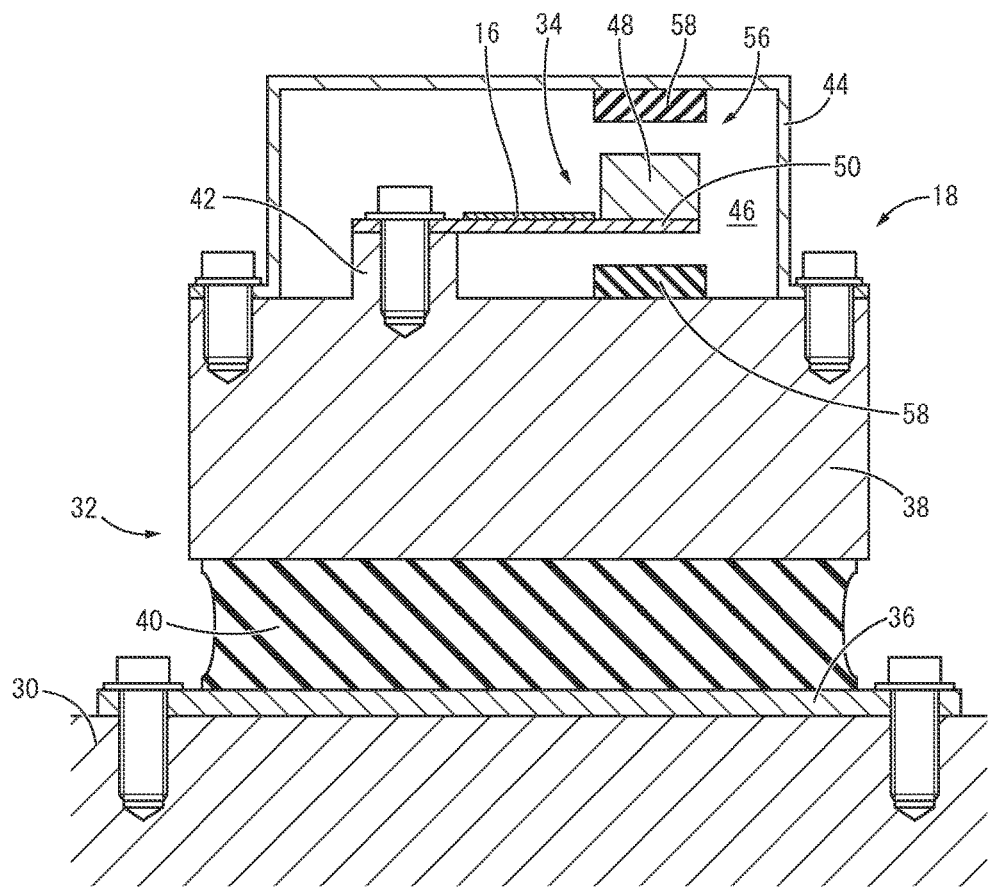
FIG. 3 is a vertical cross sectional view showing the vibration power generation device employed in the sensor device shown in FIG. 1.

Specifically, the vibration power generation device 18 of the present embodiment, whose simplified structure is shown in FIG. 3, is equipped with a multiple-degree-of-freedom vibration system including a first vibration system 32 attached to a body 30 as a vibrating member, and a second vibration system 34 attached to the body 30 via the first vibration system 32. With the description hereafter, unless there is a specific explanation, the vertical direction means the vertical direction in FIG. 1 which is the main vibration input direction from the body 30.

In more specific detail, the first vibration system 32 has a constitution for which an attachment member 36 and a first mass member 38 are elastically connected by a connecting rubber elastic body 40 as a first spring member, and by the attachment member 36 being fixed to the body 30 by a bolt or the like, the first mass member 38 is elastically connected to the body 30 by the connecting rubber elastic body 40. The shape and forming material of the first mass member 38 is not particularly restricted, but it is desirable to be formed from a material with a high specific gravity to make it more compact, and with this embodiment, this is a member exhibiting a solid rectangular block shape formed from iron. Furthermore, a support projection 42, which serves as a support part, projecting upward is integrally formed on the first mass member 38, and a screw hole is formed so as to open on that top surface. The connecting rubber elastic body 40 is a rectangular block shaped rubber elastic body, it is interposed between the attachment member 36 and the first mass member 38 arranged facing opposite vertically, its bottom surface is adhered to the attachment member 36, and its top surface is adhered to the first mass member 38.

As the material of the rubber elastic body used as the connecting rubber elastic body 40, natural rubber, synthetic rubber, or a blended rubber of natural rubber and synthetic rubber is used. As synthetic rubber, examples include styrene-butadiene rubber, butadiene rubber, isoprene rubber, chloroprene rubber, isobutylene-isoprene rubber, chlorinated-isobutylene-isoprene rubber, acrylonitrile-butadiene rubber, hydrogenated-acrylonitrile-butadiene rubber, ethylene-propylene-diene rubber, ethylene-propylene rubber, acrylic rubber, silicone rubber and the like.

Also, the first mass member 38 of this embodiment is equipped with a cover member 44. The cover member 44 has a rectangular box shape that opens downward, and by a flange shaped fixing piece provided at the opening part being fixed by a bolt or the like to the first mass member 38, it is attached to the first mass member 38 so as to cover the top surface. By mounting of the cover member 44 as noted above, above the first mass member 38, a housing area 46, which is separated from the outside and serves as a housing space, is defined by the cover member 44, and the support projection 42 of the first mass member 38 projects in the housing area 46. Note that in FIG. 1, the cover member 44 is omitted for illustrative purposes.

Furthermore, it is desirable to have the mass: $m_1$ of the first mass member 38 including the cover member 44 be 10% or greater of the equivalent mass: M of the body 30 ($m_1 \geq 0.1*M$). By doing this, the first mass member 38 has sufficient effect on the vibration state of the body 30, and since it is possible to function as a dynamic damper, a vibration decrease of the body 30 can be expected by the vibration offset.

Also, a second vibration system 34 is arranged in the housing area 46. With the second vibration system 34, a second mass member 48 is attached to one end part of a plate spring 50 as a second spring member, and the other end part of the plate spring 50 is attached to the first mass member 38. As a result, the second vibration system 34 has a cantilever structure in which the second mass member 48 is elastically connected to the first mass member 38 by the plate spring 50.

The second mass member 48 has a rectangular block shape, and is formed from a high specific gravity material such as iron or the like, the same as the first mass member 38. Also, with this embodiment, the mass: $m_2$ of the second mass member 48 is set so as to satisfy $m_1*X > m_2*Q$ with the mass: $m_1$ of the first mass member 38. Note that X indicates the response magnification (resonance response magnification) at the natural frequency of the first vibration system 32, and Q indicates the resonance response magnification of the second vibration system 34, and with this embodiment, the resonance response magnification: Q of the second vibration system 34 is larger than the resonance response magnification: X of the first vibration system 32 (X<Q). Also, preferably, by having the mass: $m_2$ of the second mass member 48 be ⅕ or less as large as the mass: $m_1$ of the first mass member 38 ($m_2 < m_1/5$), the second mass member 48 is smaller and lighter than the first mass member 38. In this way, by having the second mass member 48 be lighter than the first mass member 38, while the natural frequency of the vibration system is set according to the frequency of the vibration subject to power generation, the spring constant of the plate spring 50 is set to be sufficiently small, and it is possible to effectively generate relative displacement of the first mass member 38 in relation to the second mass member 48.

The plate spring 50 is a longitudinal plate shaped metal member formed from electrically conductive spring steel, and the second mass member 48 is fixed to one lengthwise direction end part, and the other lengthwise direction end part is overlapped and fixed by a screw to the support projection 42 of the first mass member 38. By doing this, the second mass member 48 is elastically connected to the first mass member 38 via the plate spring 50, and relative displacement of the second mass member 48 in relation to the first mass member 38 is allowed by elastic deformation in the shearing direction which is the plate thickness direction of the plate spring 50 (vertical direction in FIG. 3). As is clear from this, the vibration power generation device 18 is equipped with a two-degree-of-freedom vibration system constituted by the first vibration system 32 and the second vibration system 34.

With this embodiment, the mechanical natural frequency: $f_{r2}$ when the second vibration system 34 is handled as a one-degree-of-freedom vibration system is set to be a lower frequency than the mechanical natural frequency: $f_{r1}$ when the first vibration system 32 is handled as a one-degree-of-freedom vibration system ($f_{r2} < f_{r1}$). Furthermore, it is desirable for the natural frequency: $f_{r1}$ of the first vibration system 32 alone to be $\sqrt{2}$ times or less in relation to the natural frequency: $f_{r2}$ of the second vibration system 34 alone ($f_{r2} < f_{r1} \leq \sqrt{2}*f_{r2}$). By doing this, it is possible to avoid problems such as a decrease in power generating efficiency due to the offset displacement volume of the first mass member 38 in relation to the second mass member 48 being inhibited by the vibration damping action by the so-called sky hook damper effect. The mechanical natural frequency: $f_{r1}$ with the one-degree-of-freedom vibration system of the first vibration system 32 alone is calculated as with [Formula 1] from the mass: $m_1$ of the first mass member 38 and the spring constant: $k_1$ of the connecting rubber elastic body 40. The mechanical natural frequency: $f_{r2}$ with the one-degree-of-freedom vibration system of the second vibration system 34 alone is calculated as with [Formula 2] from the mass: $m_2$ of the second mass member 48 and the spring constant: $k_2$ of the plate spring 50.

$$f_{r1} = \frac{1}{2\pi}\sqrt{\frac{k_1}{m_1}} \qquad \text{[Formula 1]}$$

$$f_{r2} = \frac{1}{2\pi}\sqrt{\frac{k_2}{m_2}} \qquad \text{[Formula 2]}$$

Also, the power generating element 16 is adhered to the plate spring 50. For the power generating element 16, a typical piezoelectric element or electrostrictive element or the like is preferably used. By being overlapped on and adhered to the surface of the plate spring 50, the power generating element 16 is arranged between the first mass member 38 and the second mass member 48. Also, during vibration input, by having external force applied to the first mass member 38 from the body 30 transmitted to the second mass member 48, the first mass member 38 and the second mass member 48 are relatively displaced, and by the plate spring 50 being elastically deformed, the power generating element 16 generates electricity by deforming together with the plate spring 50. Said another way, vibration energy is input to the power generating element 16 by the relative displacement of the first mass member 38 and the second mass member 48, and the power generating element 16 converts vibration energy to electrical energy according to the volume of the relative displacement of the first mass member 38 and the second mass member 48. An electrical circuit is connected to this power generating element 16, and this is electrically connected to the rectifier and electric storage circuit 28, the sensor portion 14 or the like. When using a piezoelectric element as the power generating element 16, as the forming material for that, for example a ceramic material, a monocrystalline material or the like can be used. More specifically, for example, any of lead zirconate titanate, aluminum nitride, lithium tantalate, lithium niobate or the like can be used suitably as the forming material for the piezoelectric element.

With this embodiment, the power generating element 16 adhered to the plate spring 50 is arranged in the housing area 46 separated from the external space by the cover member 44, and adhering of foreign matter such as water, dust or the like is prevented by being covered by the cover member 44.

With this embodiment, a stopper 56 that restricts the relative displacement of the second mass member 48 in relation to the first mass member 38 is provided, excessive deformation of the plate spring 50 and the power generating element 16 is prevented, and damage to the power generating element 16 is avoided. In specific terms, by having the second mass member 48 abut the top surface of the first mass member 38 and the upper bottom wall internal surface of the cover member 44, displacement of the second mass member 48 is restricted, and the stopper 56 is constituted including the first mass member 38 and the cover member 44. Also, with this embodiment, a stopper rubber 58 is adhered respectively on the top surface of the first mass member 38 and the upper bottom wall internal surface of the cover member 44, and the second mass member 48 is made to abut in a buffering manner the first mass member 38 and the cover member 44 via the stopper rubber 58.

With the vibration power generation device 18 of this embodiment constituted in this way, in the state mounted on the body 30, the vibration energy of the body 30 is converted to electrical energy and extracted by the power generating element 16. In light of that, with the vibration power generation device 18, by providing a two-degree-of-freedom vibration system and also arranging the power generating element 16 between the first and second mass members 38 and 48, efficient power generation is realized by the power generating element 16.

Figure 4:
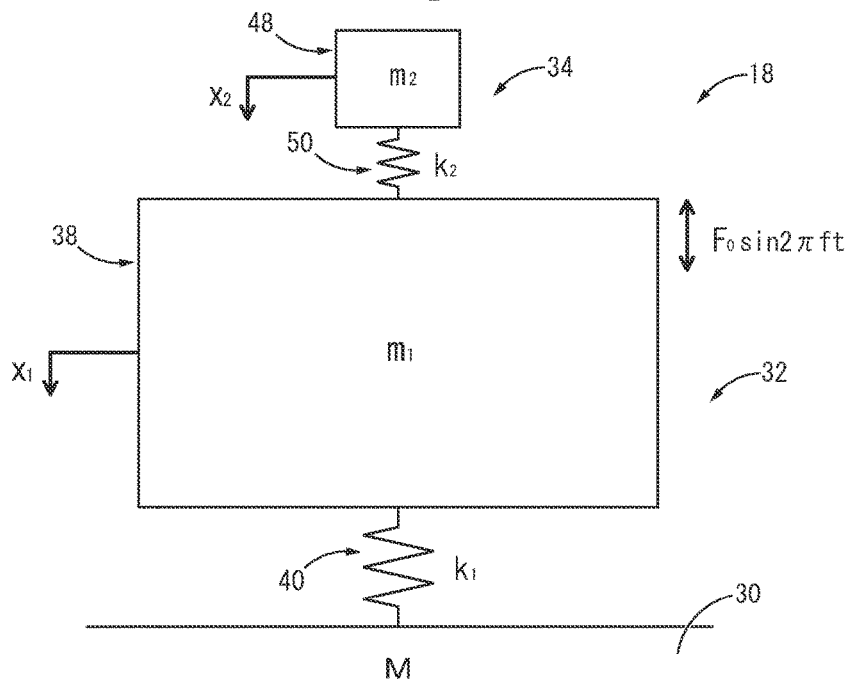
FIG. 4 is a vibration model suitable for explaining the vibration power generation device shown in FIG. 3.

With this kind of vibration power generation device 18, mechanically, as described above, a two-degree-of-freedom vibration system is constituted for which the first vibration system 32 comprising the first mass member 38 and the connecting rubber elastic body 40 as the first spring member, and the second vibration system 34 comprising the second mass member 48 and the plate spring 50 as the second spring member are connected in series, so it is possible to analyze this using a known multiple-degree-of-freedom system type vibration model. Specifically, the vibration model of the mechanical vibration system of this vibration power generation device 18 is as shown in FIG. 4, and this is expressed by the known two-degree-of-freedom system motion equation shown in [Formula 3]. With [Formula 3], $x_1$ correlates to the displacement volume of the first mass member 38 with the vibration power generation device 18, and $x_2$ correlates to the displacement volume of the second mass member 48 with the vibration power generation device 18. Furthermore, $F_0 \sin 2\pi ft$ in [Formula 3] correlates to the vibration load input from the body 30 with the vibration power generation device 18.

$$\begin{cases} m_1 \ddot{x}_1 = -k_1 x_1 - k_2(x_1 - x_2) + F_0 \sin 2\pi ft \\ m_2 \ddot{x}_2 = -k_2(x_2 - x_1) \end{cases} \qquad \text{[Formula 3]}$$

As is well known, the $\Omega_1$ and $\Omega_2$, ($\Omega_1 < \Omega_2$) found as the solution of the typical two-degree-of-freedom vibration system motion equation shown in [Formula 3] are the respective natural frequencies of the two-degree-of-freedom vibration system. However, the vibration power generation device 18 as the mechanical device is understood as a two-degree-of-freedom vibration system, but the vibration energy to the power generating element 16 is applied as offset deformation volume of the second mass member 48 in relation to the first mass member 38. Because of that, by the phase difference of the first mass member 38 and the second mass member 48 being approximately 180 degrees so they are displaced in the reverse direction, the vibration energy applied to the vibration power generation device 18 is efficiently applied to the power generating element 16 and it is possible to obtain a large amount of generated electric power.

To give a specific explanation, with the natural frequencies: $\Omega_1$ and $\Omega_2$ of the two-degree-of-freedom vibration system described above, though in theory either one can have the quantity of motion of the mass displacement be the peak, with the low frequency up to the first natural frequency: $\Omega_1$, the first and second mass members 38 and 48 move in the same phase, so it is difficult for the input vibration energy to be efficiently converted to generated electric power. In contrast to this, with the frequency from the first natural frequency: $\Omega_1$ to the second natural frequency: $\Omega_2$, the first and second mass members 38 and 48 move in the reverse phase, so it is possible to efficiently convert vibration energy to generated electric power and obtain a large generated electric power.

Here, to make it easy to understand, if we assume it is possible to understand the second vibration system 34 as a one-degree-of-freedom system for which the second mass member 48 is elastically displaced relative to the first mass member 38, then at the mechanical natural frequency: $f_{r2}$ as the one-degree-of-freedom vibration system of the second vibration system 34, the second mass member 48 of this second vibration system 34 has the phase of the first vibration system 32 in relation to the first mass member 38 reversed. In fact, in the frequency range of the natural frequency: $f_{r2}$, by the mechanical resonance phenomenon of the second vibration system 34, it is possible to efficiently obtain sufficient volume of relative displacement of the second mass member 48 in relation to the first mass member 38.

From this fact, with this embodiment for which the mechanical natural frequency of the second vibration system 34 is set to a lower frequency range than that of the first vibration system 32, even with a low frequency range up to the high frequency side natural frequency: $\Omega_2$ for which the first and second mass members 38 and 48 operate in reverse phase in the two-degree-of-freedom vibration system vibration mode, by the phase of the second mass member 48 being inverted in relation to the first mass member 38 in the frequency range exceeding the mechanical natural frequency: $f_{r2}$ as the one-degree-of-freedom vibration system of the second vibration system 34, it is possible to obtain a large amount of generated electric power with excellent power generating efficiency.

Figure 5:
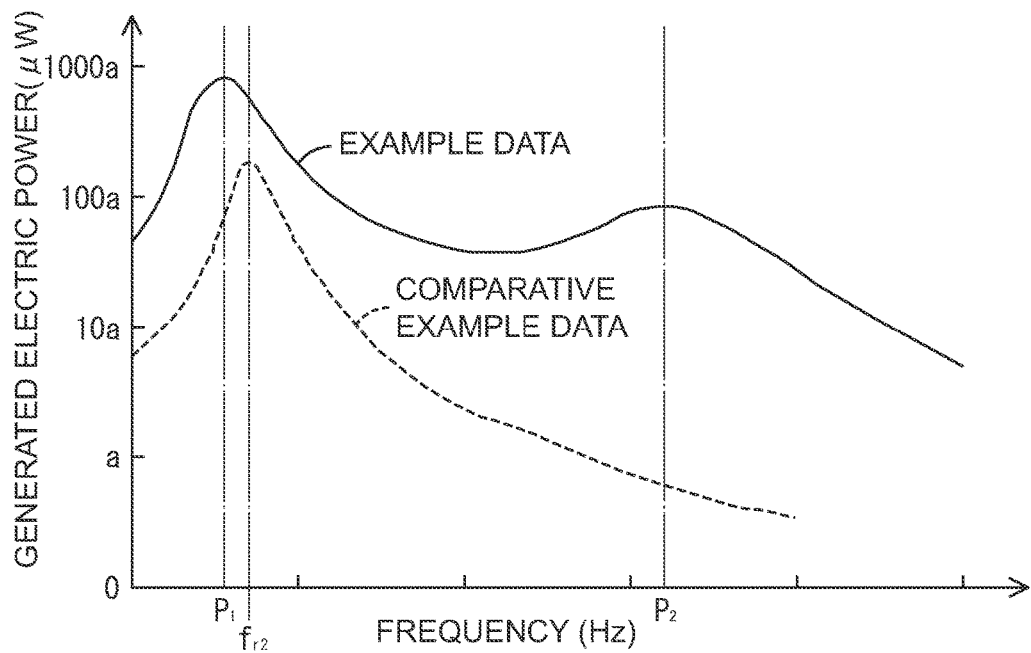
FIG. 5 is a graph showing the actual measurement values of the power generation volume of the vibration power generation device shown in FIG. 3 as the Example data, together with the Comparative Example data constituted by a one-degree-of-freedom vibration system.

This was also confirmed by the inventors with the actual measurement results of the generated electric power. Specifically, a prototype was produced of the vibration power generation device 18 constituted according to this embodiment shown in FIG. 3 and FIG. 4, and by doing sweep oscillation from the body 30 side, the frequency characteristics of the electric power generated by the power generating element 16 were measured. The results are shown in FIG. 5. In this FIG. 5, the actual measurement values of the generated electric power of the power generating element 16 are shown by a solid line as Example data, and the measurement values of the electric power generated by the power generation device comprising a mechanical one-degree-of-freedom system structure correlating to the second vibration system alone with the first vibration system omitted are shown by a dotted line as Comparative Example data.

As is also clear from FIG. 5, with the Comparative Example substantially comprising the second vibration system alone, the generated electric power is nothing more than having one peak with only the frequency range of the mechanical natural frequency: $f_{r2}$ of the second vibration system, and when the input vibration is off from the natural frequency: $f_{r2}$, there is a marked decrease in power generating efficiency. In contrast to this, with the Example of the present invention, the generated electric power has respective peaks at two frequencies: $P_1$ and $P_2$, and high power generating efficiency is maintained in the frequency range between those two frequencies $P_1$ and $P_2$, or across a broad frequency range reaching a high frequency range exceeding $P_2$. Here, the frequency: $P_2$ that is the high frequency side peak is the frequency correlating to the high frequency side natural frequency: $\Omega_2$ for which the first and second mass members 38 and 48 move in reverse phase in the vibration mode of the two-degree-of-freedom vibration system. Meanwhile, the frequency: $P_1$ that is the low frequency side peak is the frequency correlating to the low frequency side natural frequency: $\Omega_1$ for which the first and second mass members 38 and 48 move in reverse phase in the vibration mode of the two-degree-of-freedom vibration system, and is the frequency roughly corresponding to the natural frequency: $f_{r2}$ for which the phase is inverted in relation to the first mass member with the second vibration system 34 as a one-degree-of-freedom vibration system.

Also, with this embodiment, the resonance response magnification: Q of the second vibration system 34 is greater than the resonance response magnification: X of the first vibration system 32 (X<Q), and the product of the mass: $m_1$ of the first mass member 38 and resonance response magnification: X of the first vibration system 32 is greater than the product of the mass: $m_2$ of the second mass member 48 and resonance response magnification: Q of the second vibration system 34 ($m_1 * X > m_2 * Q$). By doing this, during vibration input, the amplitude of the second mass member 48 and thus the elastic deformation volume of the plate spring 50 is ensured to be large, and power generation by the power generating element 16 is realized efficiently. Also, the oscillation force applied in a resonant state to the first mass member 38 is greater than the oscillation force applied in a resonant state to the second mass member 48, so the offset vibration damping action of the input vibration by the second vibration system 34 is inhibited, and by stably generating relative displacement of the first mass member 38 and the second mass member 48, more effective power generation is realized across a wide band.

Furthermore, with the vibration power generation device 18, the mass: $m_2$ of the second mass member 48 is ⅕ or less as large as the mass: $m_1$ of the first mass member 38, and while the mechanical natural frequency of the two-degree-of-freedom vibration system is set to a designated value, the spring constant: $k_2$ of the plate spring 50 is set to be small. Because of that, relative displacement of the second mass member 48 in relation to the first mass member 38 occurs easily, and it is possible to efficiently obtain power generation volume by the power generating element 16.

Also, with this embodiment, the mechanical natural frequency: $f_{r2}$ with the one-degree-of-freedom vibration system of the second vibration system 34 alone is set to be a lower frequency than the mechanism natural frequency: $f_{r1}$ with the one-degree-of-freedom vibration system of the first vibration system 32 ($f_{r2}<f_{r1}$). By doing this, it is possible to have sufficient relative displacement of the second mass member 48 in relation to the first mass member 38 occur during vibration input, and it is possible to increase the power generating efficiency corresponding to the volume of the relative displacement of the first mass member 38 and the second mass member 48.

Furthermore, by having $f_{r2}<f_{r1}$, with the frequency range from the mechanical natural frequency: $f_{r2}$ with the one-degree-of-freedom vibration system of the second vibration system 34 to the mechanical natural frequency: $f_{r1}$ with the one-degree-of-freedom vibration system of the first vibration system 32, the first mass member 38 is displaced in the same phase in relation to the input vibration. Because of that, via the first mass member 38 that has vibration displacement in the same phase in relation to the body 30, vibration energy is transmitted more efficiently to the second vibration system 34, and there is further improvement in the power generating efficiency. Meanwhile, when $f_{r2} \gg f_{r1}$, at the low frequency side natural frequency: $\Omega_1$ with the two-degree-of-freedom vibration system, the first vibration system 32 is displaced in the reverse phase in relation to the input vibration, so it is not possible to efficiently transmit vibration energy to the second vibration system 34. In light of that, by having $f_{r2}<f_{r1}$ as with this embodiment, it is possible to set the frequency range between $P_1$ to $P_2$ shown in FIG. 5 to be sufficiently large, and to obtain excellent power generating efficiency in an even broader frequency range.

Figure 6:
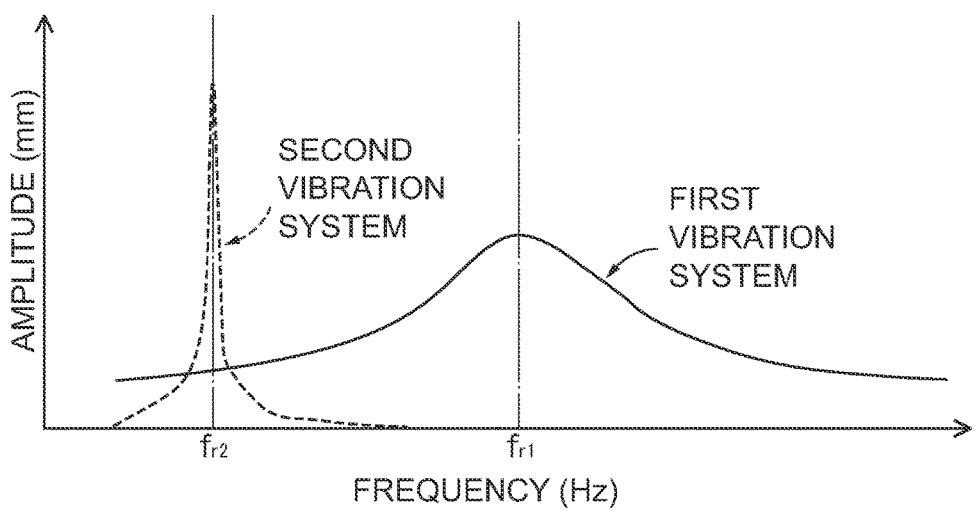
FIG. 6 is a graph showing the correlation between the frequency and amplitude when handling each vibration system constituting the vibration power generation device shown in FIG. 3 as a one-degree-of-freedom vibration system.

Also, the spring component of the first vibration system 32 constituting the two-degree-of-freedom vibration system of the vibration power generation device 18 is constituted by the connecting rubber elastic body 40 formed with a rubber elastic body, whereas the spring component of the second vibration system 34 is constituted by the plate spring 50 formed using metal. By doing this, as shown in FIG. 6, with the second vibration system 34, with a large resonance response magnification, while an amplitude for which power generation is possible is only obtained in a narrow frequency range near the resonance frequency, with the first vibration system 32, at a resonance response magnification smaller than that of the second vibration system 34, it is possible to obtain an amplitude at which power generation is possible across a broad frequency range. Because of that, by combining the first vibration system 32 and the second vibration system 34 to use together, the power generation which could be realized only in a very narrow frequency range with the second vibration system 34 alone can be realized efficiently for vibration input of a broader frequency range by the broadening of characteristics based on the damping performance of the connecting rubber elastic body 40 of the first vibration system 32. By doing this, effective power generation is possible under various vibration input conditions, and it is possible to provide a vibration power generation device 18 having high practical utility. In FIG. 6, the frequency-amplitude characteristics with the one-degree-of-freedom vibration system of the first vibration system 32 alone are shown by a solid line, and the frequency-amplitude characteristics with the one-degree-of-freedom vibration system of the second vibration system 34 alone are shown by a dotted line.

Also, with the vibration power generation device 18, by having the mechanical natural frequency: $f_{r1}$ with the one-degree-of-freedom vibration system of the first vibration system 32 alone be set to a higher frequency than the electrical antiresonance frequency: $f_{a2}$ of the multiple-degree-of-freedom vibration system constituted by the first and second vibration systems 32 and 34 ($f_{r1} > f_{a2}$), power generation is realized for vibration input of a broad frequency range. Hereafter, we will give a description using an equivalent circuit considering the electrical characteristics of the second vibration system 34 shown in FIG. 7.

Figure 7:
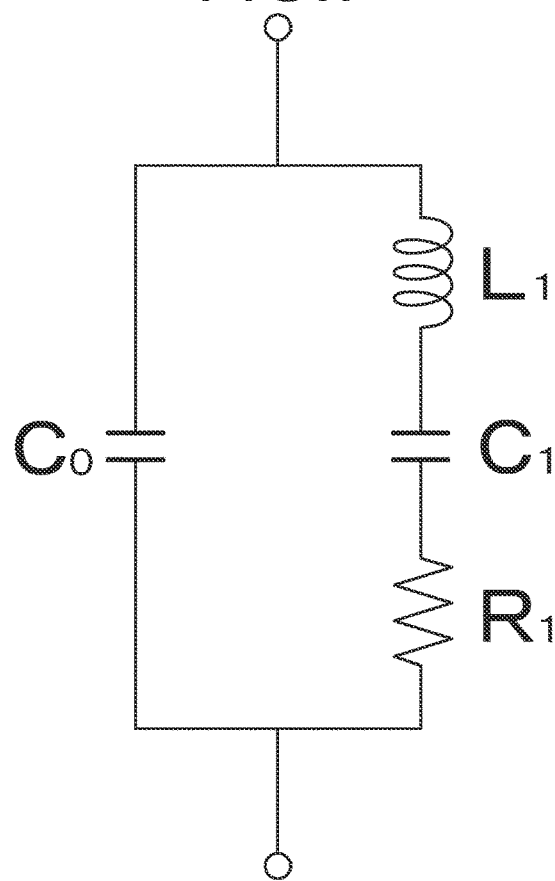
FIG. 7 is a schematic diagram showing an electrical equivalent circuit of a second vibration system of the vibration power generation device shown in FIG. 3.

The equivalent circuit of FIG. 7 is a circuit showing electromechanical conversion characteristics which are piezoelectric characteristics of the second vibration system 34 in which the power generating element 16 (piezoelectric element) is arranged, and is an item for which the mechanical vibration of the power generating element 16 is expressed as an electrical circuit by the serially arranged equivalent series inductance: $L_1$, equivalent series electrostatic capacity: $C_1$, equivalent series resistance: $R_1$, and parallel electrostatic capacity: $C_0$.

$L_1$, $C_1$, and $R_1$ are constants that are respectively uniquely determined according to the vibration mode. On the other hand, $C_0$ is the electrostatic capacity by the power generating element 16 functioning as a dielectric, and is a constant stipulated by the power generating element 16 size, dielectric constant, or the like.

Figure 8:
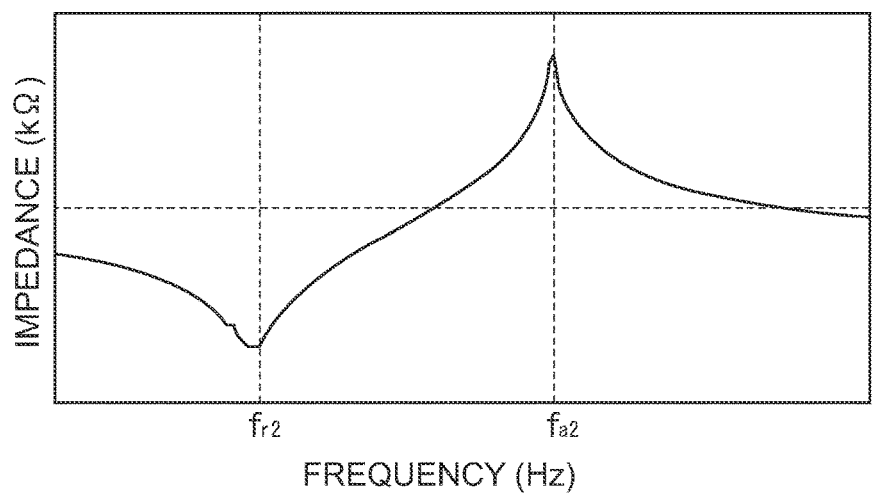
FIG. 8 is a graph showing the correlation between input vibration frequency, impedance, and phase for the equivalent circuit shown in FIG. 7.

The equivalent circuit considering the electrical characteristics of the second vibration system 34 is constituted from this kind of $L_1$, $C_1$, $R_1$, and $C_0$, so the impedance of the second vibration system 34 is as shown in the graph shown in FIG. 8 in relation to the frequency of the input vibration, and is a local minimum value with the serial resonance frequency: $f_{r2}$, and is a local maximum value with the electrical antiresonance frequency (parallel resonance frequency): $f_{a2}$. The serial resonance frequency is substantially the same as the mechanical resonance frequency: $f_{r2}$ of the second vibration system 34. Also, strictly speaking, the serial resonance frequency: $f_{r2}$ is slightly different from the frequency for which the impedance of the second vibration system 34 is a local minimum value by the effect of $C_0$, but here, they are regarded as being substantially the same. Similarly, the parallel resonance frequency: $f_{a2}$ is slightly different from the frequency for which the impedance of the second vibration system 34 is a local maximum value, but here it is regarded as being substantially the same.

As is also clear from the graph in FIG. 8, with the second vibration system 34 in which the power generating element 16 is arranged, while a large power generation volume can be obtained with the serial resonance frequency: $f_{r2}$, the power generation volume is small with the parallel resonance frequency: $f_{a2}$, and even with a higher frequency range than $f_{a2}$, the power generation volume continues at a relatively small state.

With the equivalent circuit of the second vibration system 34, the serial resonance frequency: $f_{r2}$ and the parallel resonance frequency (antiresonance frequency): $f_{a2}$ are defined by [Formula 4] and [Formula 5] hereafter.

$$f_{r2} = \frac{1}{2\pi\sqrt{L_1 C_1}} \qquad \text{[Formula 4]}$$

$$f_{a2} = \frac{1}{2\pi\sqrt{L_1 C_0 C_1/(C_0 + C_1)}} \qquad \text{[Formula 5]}$$

Meanwhile, with this embodiment, by having the vibration system of the vibration power generation device 18 have two degrees of freedom, by having the mechanical secondary natural frequency: $\Omega_1$ of the vibration system of the vibration power generation device 18 be set to a higher frequency than the mechanical antiresonance frequency of the same vibration system, the decrease in the power generation is inhibited across a broad frequency range. From this, typically, by setting the mechanical natural frequency: $f_{r1}$ of the first vibration system 32 to a higher frequency than the parallel resonance frequency: $f_{a2}$ of the equivalent circuit, it is possible to prevent a decrease in power generating efficiency across a wide band.

Yet further, more preferably, by having the mechanical resonance frequency: $f_{r1}$ of the first vibration system 32 alone be $\sqrt{2}$ times or less in relation to the mechanical resonance frequency: $f_{r2}$ of the second vibration system 34 alone ($f_{r1} \leq \sqrt{2}*f_{r2}$), a large volume of the relative displacement of the first mass member 38 in relation to the second mass member 48 is ensured for vibration input of a broad frequency range. Because of that, more highly efficient power generation is realized by the power generating element 16 for vibration input of a broad frequency range. In other words, the mechanical resonance frequency: $f_{r1}$ of the first vibration system 32 alone is preferably set in a range of $f_{a2} < f_{r1} \leq \sqrt{2}*f_{r2}$.

When the inventors examined this with experiments and the like, by having $f_{r1} \leq \sqrt{2}*f_{r2}$, it is possible to have a combined vibration state by having the vibration with the first vibration system 32 and the vibration with the second vibration system 34 transmitted to each other. Specifically, for example in a case such as when the input vibration frequency changes, even in a state such as when one vibration system stops when the first vibration system 32 and the second vibration system 34 vibrate completely independently from each other, by the other vibration system having an effect on that one vibration system, it is also possible to maintain a certain level of a vibrating state. By doing this, since the vibration of both is applied, it is possible to complementarily maintain the vibrating state of both vibration systems 32 and 34, so it is possible to even more efficiently achieve maintaining of the manifestation of the vibration state with the vibration systems 32 and 34 and thus realization of the target power generating state. With the first and second vibration systems 32 and 34, by setting each of the resonance frequencies to satisfy $f_{r-1} \leq \sqrt{2} * f_{r-2}$, realizing of complementary maintenance of the vibration state by combining vibrations can be understood as a help for Japanese Patent No. JP-B-4862286, for example.

By housing the vibration power generation device 18 and the sensor portion 14 with the structure described above within the case 22 for example, the sensor device 10 of the present embodiment is provided. Then, the case 22 is used as the attachment member, for example, and the sensor device 10 is attached to a vehicle with the opening part of the case 22 covered by a lid unit or the like. With this arrangement, even for the vibration input over the various frequency ranges due to difference in travel state, vibration energy is efficiently converted into electrical energy. Accordingly, stable power generation by the vibration power generation device 18 and hence stable operation of the sensor device 10 can be realized.

An embodiment of the present invention regarding the sensor device has been described in detail above, but the present invention is not limited to those specific descriptions.

Figure 9:
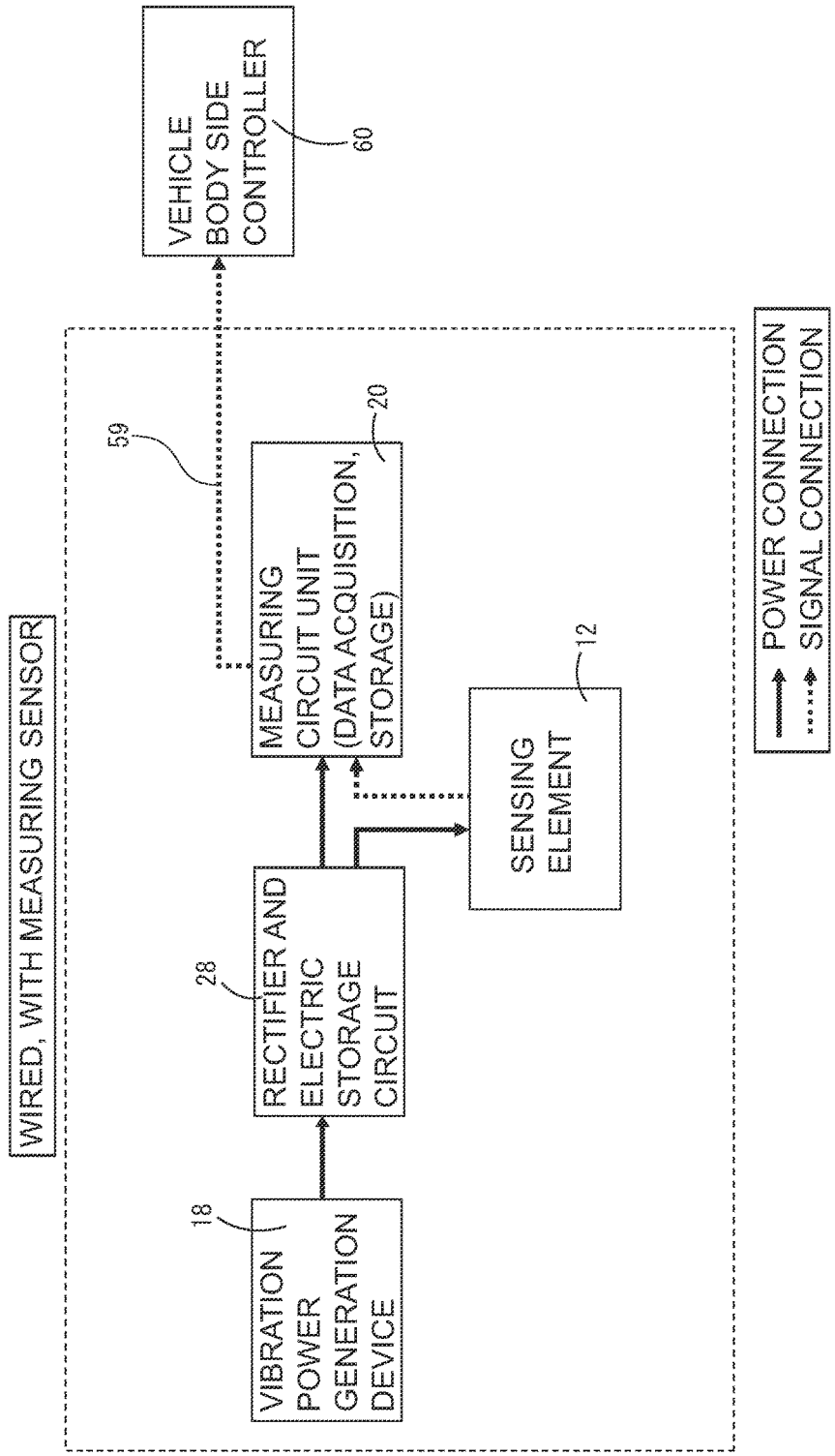
FIG. 9 is a functional block diagram suitable for explaining another mode of the sensor device shown in FIG. 1.

For example, in the case where the sensor device is mounted onto a vehicle, as illustrated by a functional block diagram in FIG. 9, detection signals in the sensor portion 14 can be transmitted through a hard-wired sensor output lead wire 59 to a vehicle body side controller 60 such as an ECU or the like that requires the detection signals.

Such wired transmission makes it possible to make use of the electric power obtained by the vibration power generation device 18 by focusing on acquisition and generation of information in the sensor portion 14. As a result, it is possible to improve detection precision accompanied by increase in required electric power, for example, to improve sampling rate, as well as to further enhance operation stability of the sensor device including the sensor portion 14.

Figure 10:
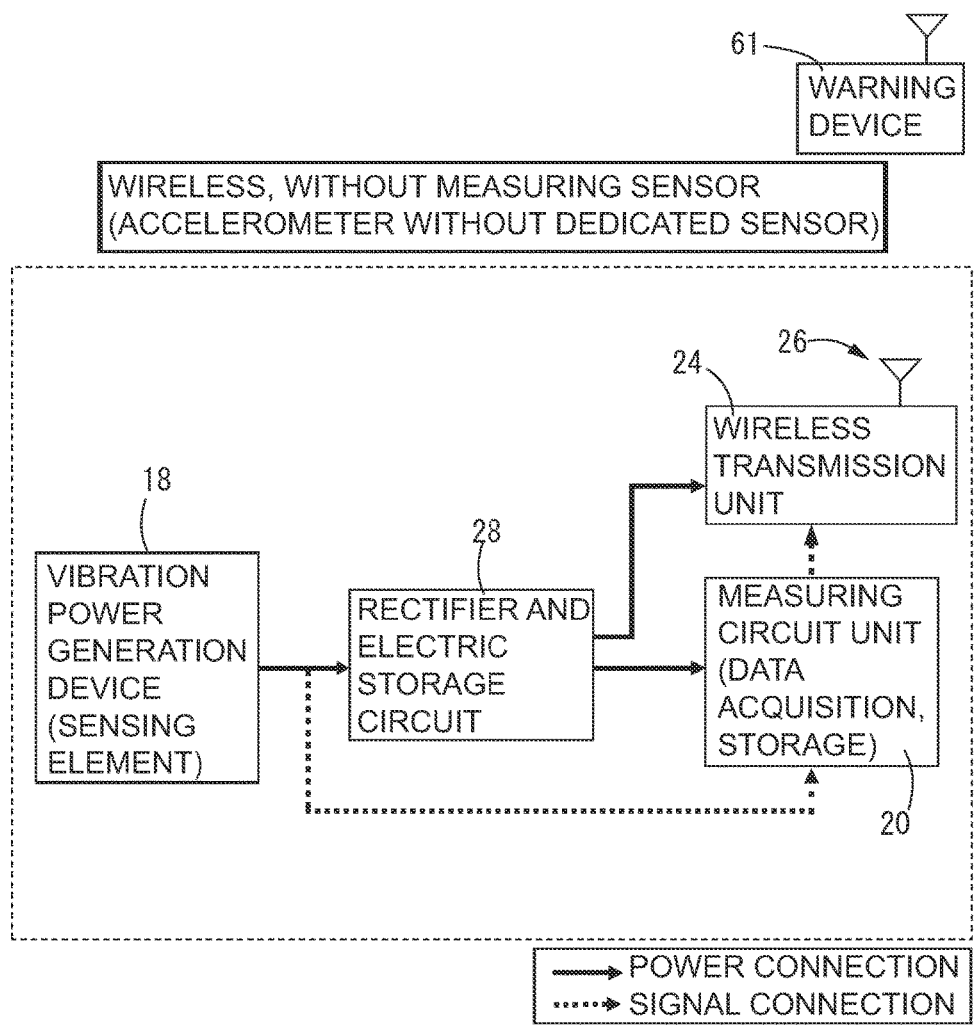
FIG. 10 is a functional block diagram suitable for explaining yet another mode of the sensor device shown in FIG. 1.

Besides, the power generating element 16 itself of the vibration power generation device 18 having a specific structure constructed in the above manner can be utilize as the sensing element. As a specific example, as illustrated by a functional block diagram in FIG. 10, for example, by focusing on the fact that power generation waveforms of the vibration power generation device 18 correspond to the input vibration, an arithmetic operation processing such as time differentiation is executed in the measuring circuit unit 20 using the power generation waveforms, whereby acceleration information can be obtained as the detection signal.

In this way, by utilizing the power generating element 16 of the vibration power generation device 18 as the sensing element, the sensor device is able to achieve a simple structure and reduction in power consumption.

Also, in the case where the sensor device is mounted onto a vehicle, since the power generation condition of the vibration power generation device 18 corresponds to the travel condition of the vehicle, the travel condition can be monitored by monitoring the power generation condition. For example, when the specific travel condition such as repeated sudden acceleration and deceleration is caught on the basis of the power generation condition, the driver can be warned by sound or light for caution. Such a warning device 61 may be provided outside, namely, in a display or inside a cabin of the vehicle for example. Specifically, the specific travel condition detected by the vibration power generation device 18 serving as the sensing element may be transmitted to the warning device 61 via the transmitting antenna 26 and the lead wire through wireless or wired transmission, so that the display shows a message or a mark, or a speaker in the cabin gives a message or an alarm which is recognizable to the driver.

Alternatively, in the case where the sensor device is mounted onto a pillar or floor of a building, the pillar or floor serves as the vibrating member and is subjected to vibrations due to vehicles passing in the neighborhood or residents walking therein, thereby obtaining electric power by the vibration power generation device 18. Moreover, by employing the warning device 61 described above for example, it is possible to caution the residents by sound or light and allow them to rapidly escape in case of earthquakes or the like.

Furthermore, in the sensor device according to the present invention, various modes other than the preceding embodiment are the employable as the vibration power generation device. For example, in FIG. 11 and FIG. 12, vibration power generation devices 62 and 64 are respectively shown as other modes employed in the present invention. Note that for the members and parts that are identical with those in the aforementioned embodiment, the same code numbers in the drawing as the respective items of the aforementioned embodiment are given, and a detailed description of those will be omitted.

Figure 11:
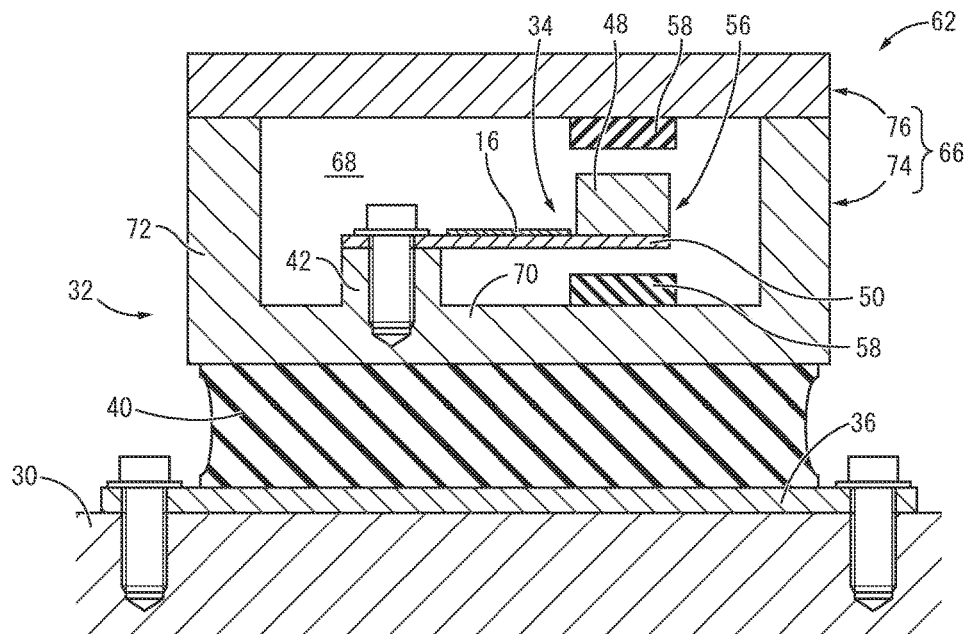
FIG. 11 is a vertical cross sectional view showing another mode of the vibration power generation device employed in the sensor device shown in FIG. 1.

Specifically, with the vibration power generation device 62 shown in FIG. 11, a first mass member 66 has a hollow structure, and with the first mass member 66, a housing space 68 is provided that is roughly cut off from the external space. The first mass member 66 of this kind of hollow structure is realized, for example, by overlapping a roughly plate shaped upper mass 76 on a lower mass 74 having roughly a tube shape with a bottom and equipped with a bottom wall 70 and a peripheral wall 72, and adhering it on the upper part opening of the lower mass 74 so as to cover it.

Also, in a state of being housed in the housing space 68 of the first mass member 66, the second vibration system 34 with roughly the same constitution as that of the aforementioned embodiment is provided. The housing space 68 is sufficiently large to allow displacement of the second mass member 48 along with elastic deformation of the plate spring 50 as the second spring member. Also, stopper rubbers 58, 58 are respectively provided on the housing space 68 at both side wall parts of the displacement direction of the second mass member 48, and the displacement volume of the second mass member 48 is buffered and restricted.

With the vibration power generation device 62 constituted in this way, it is possible to set the center of gravity position of the first mass member 66 of the first vibration system 32 and the center of gravity position of the second mass member 48 of the second vibration system 34 to be close in the height direction. In fact, the first mass member 66 and the second mass member 48 can be aligned with the height made small from the support surface, namely the upper surface of the attachment member 36 which is the adhering surface on the body 30 of the connecting rubber elastic body 40 as the first spring member, which becomes the vibration input reference surface.

In the first embodiment as well, the mass of the cover member 44 constitutes a portion of the first mass member 38. As will be understood therefrom, the first embodiment includes the first mass member having a hollow structure, and the second vibration system 34 is housed within the housing area 46 formed between the cover member 44 and the first mass member 38. Besides, the proximal end side of the plate spring 50 is supported by the support projection 42 projecting within the housing space 46 from the upper end face of the first mass member 38, which constitutes the peripheral wall of the housing space (housing area) 46. By so doing, the position at which the plate spring 50 is supported is set inward from the peripheral wall of the housing space 46. Here, with the embodiment shown in FIG. 11, it is possible to consider that the cover member 44 of the first embodiment is made thicker so as to constitute the upper mass 76. Thus, the mode shown in FIG. 11 can also be understood by the description of the first embodiment.

With this arrangement, in both of the first embodiment and the present embodiment, the position at which the proximal end side of the plate spring 50 that constitutes the second vibration system 34 is supported by the first mass member 38, 66 is set to the position near the center of gravity of the first mass member 38, 66, which is separated to the center from the outer peripheral wall of the first mass member 38, 66. As a result, regarding the desired vibration accompanied by displacement like a bounce entailing amplitude in the vertical direction by which the first mass member 38, 66 induces the plate spring 50 to bending deformation that is significant to power generation, the vertical vibration of the first mass member 38, 66 will be directly and efficiently transmitted to the plate spring 50, thereby advantageously oscillating the second vibration system 34. On the other hand, regarding vibrations in the various directions such as pitching accompanied by swinging displacement like a seesaw around the roughly center in the lateral direction working as a fulcrum in FIG. 11, torsion accompanied by rotational displacement around the straight line extending in the lateral direction in FIG. 11, or prizing accompanied by rotational displacement around the straight line extending in the vertical direction in FIG. 11, vibration amplitude becomes maximum at the outer peripheral wall of the first mass member 38, 66 in all cases. This will limit vibration transmission to the second vibration system 34 whose support point is set further to the center side than the outer peripheral wall, thereby reducing adverse effect on the plate spring 50. Thus, the desired bending deformation of the plate spring 50 and hence power generating efficiency by the power generating element 16 attached to the plate spring 50 can be stably and favorably maintained.

In particular, in the embodiment shown in FIG. 11, the upper mass 76 is made thicker than the cover member 44 of the first embodiment. Accordingly, the center of gravity of the first mass member 66 is pulled to the center side not only in the horizontal direction but also in the vertical direction so as to be set inside the housing space 68. This arrangement allows the center of gravity of the first mass member 66 and the support point of the plate spring 50 of the second vibration system 34 to be set to positions close to each other, for example, to approximately the same position. As a result, it is possible to further minimize the aforementioned vibration inputs such as pitching, torsion, prizing or the like in the first mass member 66 as well as to more effectively realize stable power generation owing to vibration transmission in the vertical direction significant to vibration power generation.

In this way, in the present mode, oscillation of the first mass member 66 and the second mass member 48 during vibration input, in particular, irregular deformation of the plate spring 50 accompanied by irregular displacement other than vertical displacement of the second mass member 48, is inhibited. This will more stably generate vibration displacement in the vertical direction which is the target main vibration input direction. As a result, the elastic deformation volume of the connecting rubber elastic body 40 and the plate spring 50 becomes large, and there is further improvement of the conversion efficiency from vibration energy to electrical energy.

In fact, the arrangement area of the second vibration system 34 is cut off from the external space by the first mass member 66, so it is possible to give dust proof properties and water proof properties with a simple structure for the arrangement area of the second vibration system 34 without requiring a separate cover structure or the like.

In addition, by the first mass member 66 having a hollow structure, while ensuring a large mass weight in its outer circumference part with a large capacity, it is possible to house the second vibration system 34 in the housing space 68, and to avoid large projection upward from the first mass member 66 as with the aforementioned embodiment. As a result, while ensuring sufficient mass of the first mass member 66, it is possible to suppress the overall size of the vibration damping device to be small, especially in the height direction.

Figure 12:
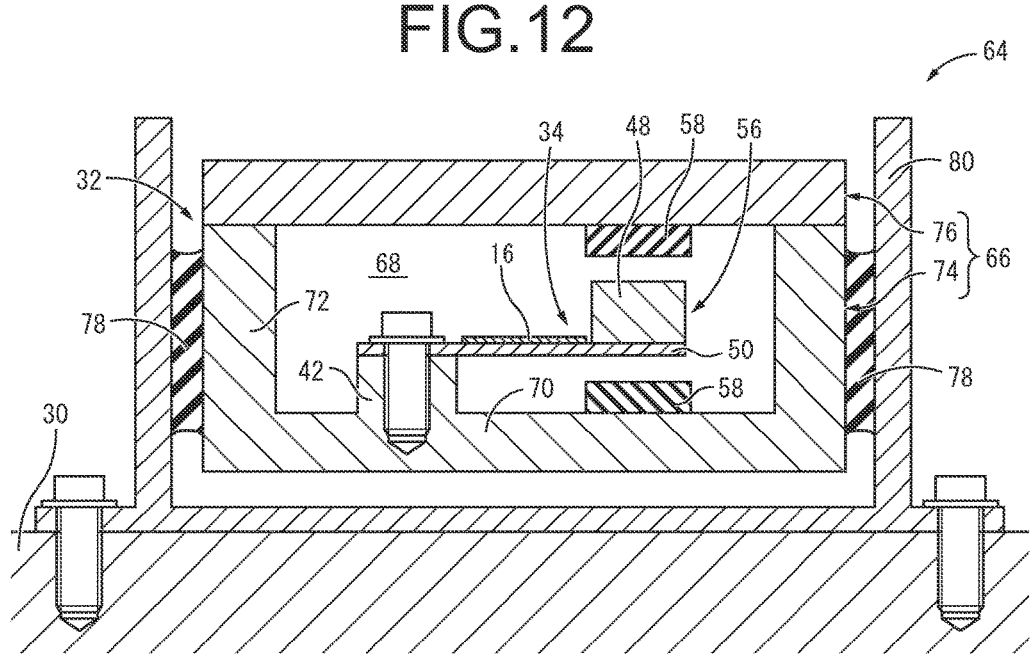
FIG. 12 is a vertical cross sectional view showing yet another mode of the vibration power generation device employed in the sensor device shown in FIG. 1.

Also, with the vibration power generation device 64 shown in FIG. 12, the same as with the vibration power generation device 62 shown in FIG. 11, the second vibration system 34 is provided in a state housed in the housing space 68 of the hollow structure first mass member 66. Meanwhile, the first mass member 66 is elastically connected to the body 30 as the vibrating member by a first spring member 78 provided on the outer circumference surface of the peripheral wall 72.

Specifically, an attachment member 80 adhered by a bolt or the like to the body 30 is formed using a vertical wall structure separated to the outer circumference side of the first mass member 66, and the outer circumference surface of the first mass member 66 is aligned facing in opposition in the direction roughly orthogonal to the main vibration input direction to the attachment member 80. Then, by the first spring member 78 comprising a rubber elastic body being arranged between opposed faces of the outer circumference surface of the first mass member 66 and the attachment member 80, the first mass member 66 is elastically supported by the attachment member 80.

The first spring member 78 can be provided across the entire circumference of the first mass member 66, but it can also be provided so as to be positioned at a suitable number of locations on the circumference.

With the vibration power generation device 64 constituted in this way, since the first spring member 78 of the first vibration system 32 mainly undergoes shear deformation in the main vibration input direction by vibration from the body 30, it is possible to do low dynamic spring tuning, and to have an improvement in the degree of freedom of the characteristics tuning With the vibration power generation device 64 of this embodiment as well, it is also possible to do characteristics tuning by complementarily interposing a compression rubber between opposed faces of the bottom wall 70 of the first mass member 66 and the bottom wall of the attachment member 80.

Instead, with the vibration power generation device employed in the present invention, for example, in the vibration system of the vibration power generation device, it is also possible to use a multiple-degree-of-freedom vibration system of three degrees of freedom or greater by elastically connecting in series three or more mass members respectively via spring members. By doing this, it is possible to obtain high power generating efficiency for vibration input of an even broader frequency range. When using the multiple-degree-of-freedom vibration system of three degrees of freedom or greater, it is possible to select two mass members that are mutually elastically connected, and to provide a power generating element only between those mass members, but it is also possible to respectively provide power generating elements between a plurality of sets of mass members that are mutually elastically connected and arranged adjacent to each other.

Also, for example, it is also possible to constitute the multiple-degree-of-freedom vibration system of the vibration power generation device by respectively elastically connecting two or more second mass members to the first mass member via two or more second spring members that are in parallel and mutually independent. By doing this, since a plurality of second vibration systems are constituted, it is possible to have the mechanical natural frequencies of those second vibration systems alone be mutually different, and to realize effective power generation for vibration input of a broader frequency range. Alternatively, by having the mechanical natural frequencies of the second vibration systems alone be mutually the same, it is possible to improve the power generation efficiency with respect to vibration input of a specific frequency range.

Also, as the power generating element, in addition to being able to use any of a piezoelectric element, an electrostrictive element, a magnetostrictive element or the like for the power generating element, it is also possible to use a power generating structure using a solenoid operated system or the like using an electret or cross flux time changes. As can be understood from this, the specific structure of the second mass member and the second spring member constituting the second vibration system is not limited, and for example it is also possible to use as the second spring member a coil spring, rubber elastic body, rod spring or the like. Similarly, the specific structure of the first mass member and the first spring member is not particularly limited, and for example it is also possible to use as the first spring member a metal spring such as a coil spring, plate spring, rod spring or the like.

Also, with the vibration power generation device 18(62, 64) of the aforementioned embodiments, by adjusting the mass ratio of the first mass member 38(66) in relation to the body 30, the first vibration system 32 applies a vibration damping action to the vibration of the body 30, but giving a function as a vibrating damping device to the vibration power generation device is not essential for the present invention. In other words, it is also possible to have the mass of the first mass member be less than 10% of the equivalent mass of the vibrating member, and it is also possible to arrange a vibration damping device such as a dynamic damper or the like separate from the vibration power generation device.

With the aforementioned embodiments, the mechanical natural frequency: $f_{r2}$ when the second vibration system 34 is handled as a one-degree-of-freedom vibration system was set to be a lower frequency than the mechanical natural frequency: $f_{r1}$ when the first vibration system 32 is handled as a one-degree-of-freedom vibration system ($f_{r2}<f_{r1}$). In addition to that, the mass: $m_2$ of the second mass member 48 was set to satisfy $m_1*X>m_2*Q$ with the mass: $m_1$ of the first mass members 38 and 66 (X and Q are respectively the resonance response magnification of the first vibration system 32 and the second vibration system 34). However, the power generation device of the present invention is not limited to these modes.

Specifically, even in a case when the mechanical natural frequency: $f_{r2}$ when the second vibration system 34 is handled as a one-degree-of-freedom vibration system is set to be a higher frequency than the mechanical natural frequency: $f_{r1}$ when the first vibration system 32 is handled as a one-degree-of-freedom vibration system ($f_{r2}>f_{r1}$), when the product of the mass: $m_1$ of the first mass members 38 and 66 and the resonance response magnification: X of the first vibration system 32 is close to the product of the mass: $m_2$ of the second mass member 48 and the resonance response magnification: Q of the second vibration system 34 ($m_1*X \approx m_2*Q$), an increase in power generation volume is obtained by the interaction of the first vibration system 32 and the second vibration system 34. Therefore, with the power generation device of the present invention, it is acceptable for the mechanical natural frequency: $f_{r2}$ when the second vibration system 34 is handled as a one-degree-of-freedom vibration system to be different from the mechanical natural frequency: $f_{r1}$ when the first vibration system 32 is handled as a one-degree-of-freedom vibration system ($f_{r1} \neq f_{r2}$).

Furthermore, with the vibration power generation devices 62 and 64 shown in FIGS. 11 and 12, the lower mass 74 is roughly a tube shape with a bottom and the upper mass 76 is a roughly plate shape, the housing space 68 is formed by covering the top part opening part of the lower mass 74 from above with the upper mass 76, and the second vibration system 34 was housed inside this housing space 68, but the invention is not limited to this mode. Specifically, for example, it is also possible to have the lower mass be a roughly plate shape and for the upper mass to be an inverted roughly tube shape with a bottom, or for the first mass member to be constituted from a tube shaped member that opens to the side and a member that covers this side opening part.

Also, in the preceding embodiments, the sensor device was attached to the vehicle so as to constitute a vehicle-use sensor device, but the present invention is not limited to these modes, and as long as there is vibration input of an amount that is capable of power generation, the vibrating member is not particularly limited. Moreover, the power generation device of the present invention can be particularly suitably used when the vibration levels of multiple types of vibration become maximum in mutually different vibration frequency ranges in the vibrating member. In specific terms, for example, with a washing machine for which the vibration frequency changes with the laundry weight or the like, with a refrigerator for which the vibration frequency changes according to the operation rate of the refrigerating machine or the like, with an automobile for which the vibration frequency changes according to the traveling state, dents and bumps in the road surface or the like, with a machine tool for which the vibration frequency changes according to the processing state or the like, with a bridge for which the vibration frequency changes according to the weight or the like of the passing vehicle, or with a pillar, floor or the like of a building, the case, body or the like can become the vibrating member on which to mount the power generation device.

Implementation of the vibration power generation devices 18, 62, 64 according to the present invention described above is not limited in the sensor device 10 shown in the preceding embodiments. Hereafter, embodiments implemented in a vehicle-use light emitting device and a building-use light emitting device are described in reference to the drawings. Note that the vibration power generation device has the same structure as those in the preceding embodiments, and to facilitate understanding, has been assigned identical symbols with those in the preceding embodiments in the drawings.

Figure 13:
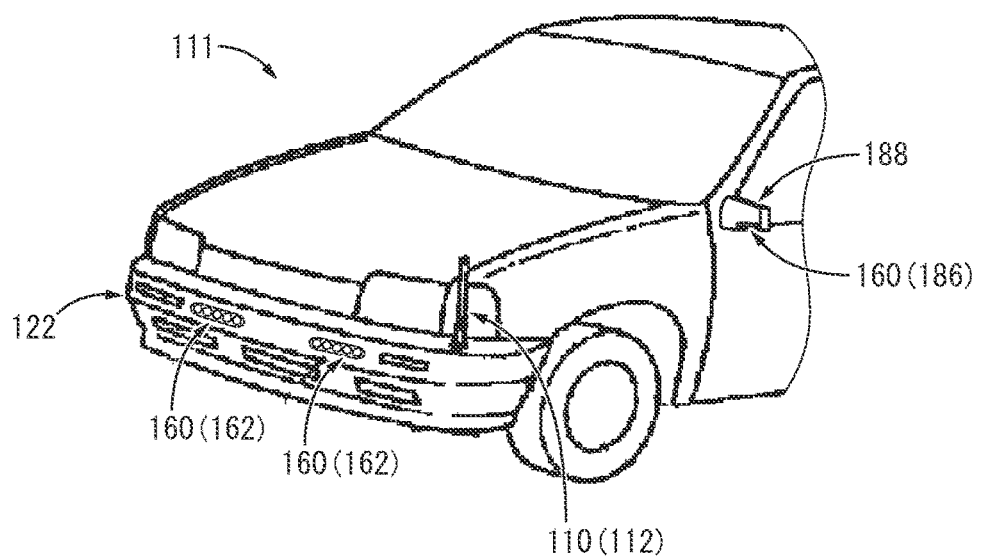
FIG. 13 is a perspective view of a principal part of an automobile including one embodiment of a vehicle-use light emitting device according to the present invention.
Figure 14:
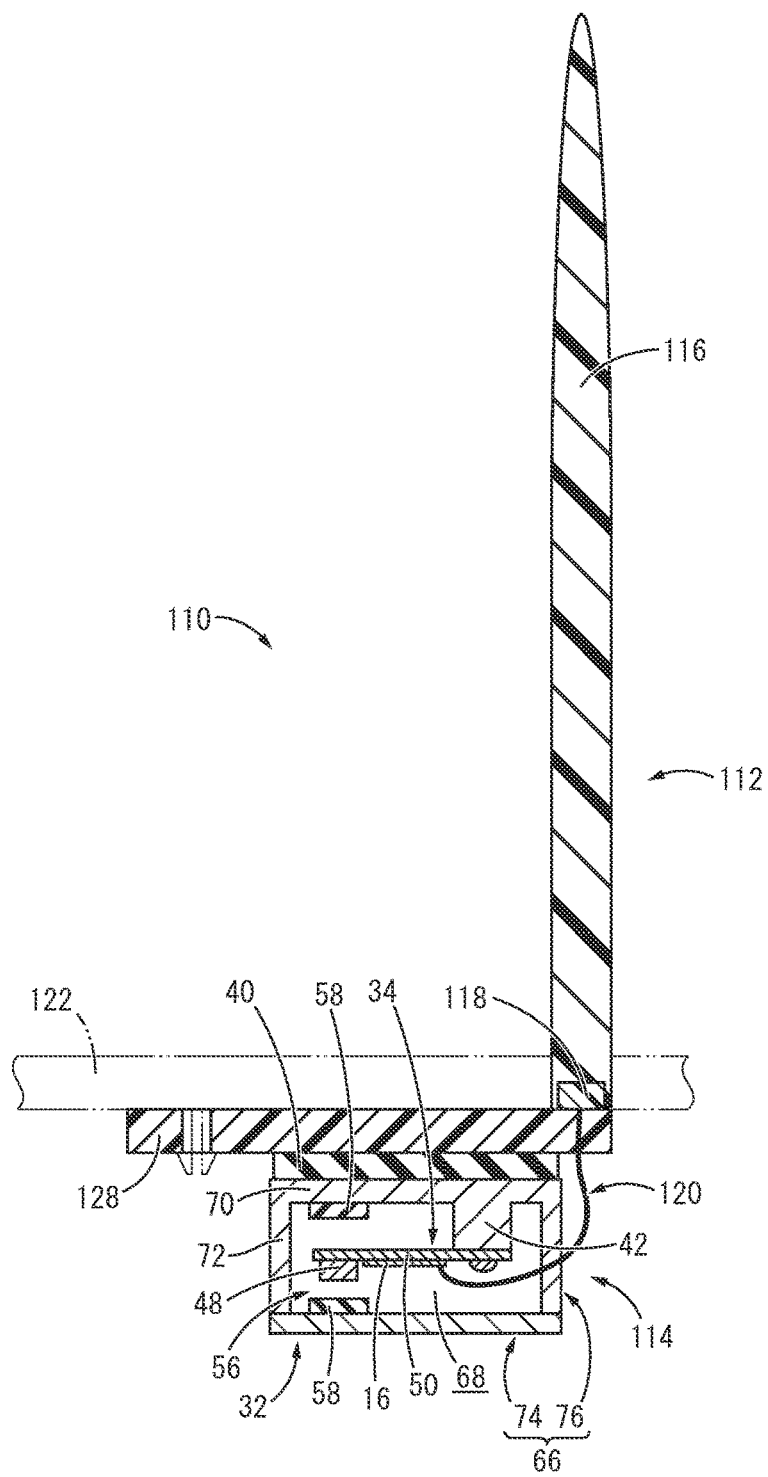
FIG. 14 is a vertical cross sectional view of the vehicle-use light emitting device as the one embodiment of the present invention.

FIG. 13 depicts a front part of an automobile 111 equipped with a vehicle-use light emitting device 110 of construction according to the present invention. As shown in FIG. 14, the vehicle-use light emitting device 110 includes a corner pole 112 serving as an emitter and a vibration power generation device 114 serving as an operation power supply. In the description hereinbelow, as a general rule the vertical direction refers to the vertical direction in FIG. 14, which coincides with the vertical direction as the device is installed in a vehicle.

Described more specifically, the corner pole 112 has a structure in which a light guide pole 116 accommodates an LED 118 serving as a light source. The light guide pole 116 is a transparent or translucent member made of synthetic resin such as acrylic, and has a tapered rod shape extending upward in a straight line.

In the basal end portion of the light guide pole 116, an LED 118 is housed. The LED 118 has a known structure in which a wiring harness 120 serving as a power feed wiring is connected to a substrate (not shown), and is configured to emit a light by the electric power being supplied to the substrate through the wiring harness 120. The light of the LED 118 is led upward by the light guide pole 116 and emits peripherally outward, so that the light guide pole 116 entirely or partially emits a light to be easily visible from its surroundings.

Besides, the vibration power generation device 114 is attached to the corner pole 112. The vibration power generation device 114 has substantially the same structure as the vibration power generation device 62 shown in FIG. 11 in the preceding embodiment, and comprises a multiple-degree-of-freedom vibration system including a first vibration system 32 configured to attach to a bumper 122 as a vibrating member, and a second vibration system 34 configured to attach to the bumper 122 via the first vibration system 32. In the present embodiment, the vibration power generation device 114 is in the mode in which the vibration power generation device 62 shown in FIG. 11 is installed upside down. That is, an upper mass 76 has an inverted, roughly tube shape with a bottom, and a lower mass 74 has a roughly plate shape.

By connecting the corner pole 112 to the vibration power generation device 114 which is able to exhibit excellent power generating efficiency as mentioned above, the vehicle-use light emitting device 110 of the present embodiment is constituted as shown in FIG. 14. Specifically, for the corner pole 112, the basal end portion of the light guide pole 116 and the LED 118 are fixed to an attachment member 128 of the vibration power generation device 114. Then, by the LED 118 of the corner pole 112 and a power generating element 16 of the vibration power generation device 114 being electrically connected by the wiring harness 120, the operation power supply to make the LED 118 emit is constituted by the vibration power generation device 114.

It is also acceptable, for example, to dispose a circuit for filtering electricity obtained by the power generating element 16, a control means for controlling on and off of the electric power supply to the LED 118 and the like within the housing space 68. In particular, providing these circuit, control means, and the like inside the housing space 68 is able to protect the circuit, control means and the like.

With the vehicle-use light emitting device 110 of the above construction, since the vibration power generation device 114 is attached to the bumper 122 that constitutes the end of the automobile 111, vibration with a large amplitude is input to the power generating element 16, thereby realizing more efficient power generation. In particular, the bumper 122 is an end constituent component which is a separate component from the main frame of the automobile 111, and does not include any vibration damping structure that reduces vibration transmission to the bumper 122. Thus, large vibration energy is input to the vibration power generation device 114, thereby efficiently obtaining electric power through vibration power generation. In addition, since the vibration energy of the bumper 122 is converted into the electrical energy by the vibration power generation device 114 and supplied to the LED 118, vibration of the bumper 122 will be reduced.

Besides, during driving of the automobile 111 when vibration is input, the electric power obtained by the power generation of the vibration power generation device 114 is stably supplied to the corner pole 112. This allows the corner pole 112 to emit a light without needing labor such as a battery change, charging or the like. Moreover, during parking, no vibration is input to the vibration power generation device 114 and electric power supply to the LED 118 stops, so that the corner pole 112 automatically stops light emission. Thus, it is possible to automatically switch on and off of light emission of the corner pole 112 without any operation.

Also, with the vibration power generation device 114, by setting a frequency range of input vibrations for which power generation is effectively performed (for example, a low frequency range that corresponds to engine shake during driving) and a frequency range for which substantially no power generation is performed (for example, a medium-frequency range that corresponds to idling vibration at a stop), on and off of light emission of the corner pole 112 can be automatically switched depending on the travel state of the automobile 111.

In addition, since the vibration power generation device 114 and the corner pole 112 are connected to each other so as to be closely arranged, the wiring harness 120 for supplying electric power to the LED 118 can be made short. Therefore, it is possible to reduce weight of the wiring harness 120 so as to achieve reduced weight of the vehicle, as well as to avoid troubles such as a break of other component due to interference by the wiring harness 120, whereby handling of the wiring harness 120 becomes easy.

Moreover, in the vibration power generation device 114, it is possible to set the center of gravity position of the first mass member 66 of the first vibration system 32 and the center of gravity position of the second mass member 48 of the second vibration system 34 to be close to the center portion in relation to the outer peripheral wall of the first mass member 66 in the horizontal direction, as well as to be close in the height direction. In fact, the first mass member 66 and the second mass member 48 can be aligned with the height made small from the support surface, which is the adhering surface on the bumper 122 of the connecting rubber elastic body 40 as the first spring member, which becomes the vibration input reference surface.

Accordingly, oscillation of the first mass member 66 and the second mass member 48 during vibration input is inhibited, thereby more stably generating vibration displacement in the vertical direction which is the target main vibration input direction. As a result, the elastic deformation volume of the connecting rubber elastic body 40 and the plate spring 50 becomes large, and there is further improvement of the conversion efficiency from vibration energy to electrical energy.

In fact, the arrangement area of the second vibration system 34 is cut off from the external space by the first mass member 66, so it is possible to give dust proof properties and water proof properties with a simple structure for the arrangement area of the second vibration system 34 without requiring a separate cover structure or the like.

Additionally, by the first mass member 66 having a hollow structure, while ensuring a large mass weight in its outer circumference part with a large capacity, it is possible to house the second vibration system 34 in the housing space 68, and to avoid large projection downward from the first mass member 66. As a result, while ensuring sufficient mass of the first mass member 66, it is possible to suppress the overall size of the vibration power generation device 114 to be small, especially in the height direction. Besides, every effect attained by the aforementioned vehicle-use sensor device can be similarly exhibited by the vehicle-use light emitting device in the present embodiment.

Furthermore, as depicted in FIG. 13, the bumper 122 of the automobile 111 is also equipped with a vehicle-use light emitting device 160 as another embodiment of the present invention related to the vehicle-use light emitting device.

Figure 15:
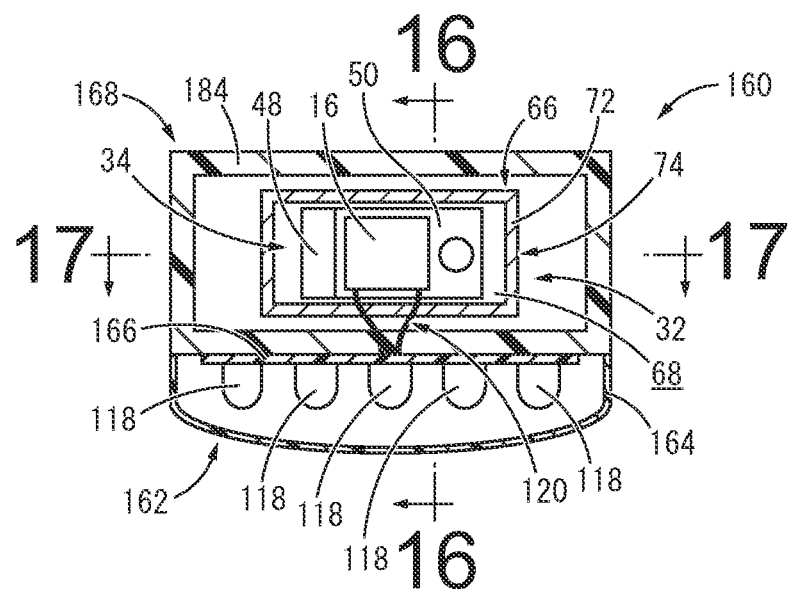
FIG. 15 is a cross sectional view of another embodiment of the vehicle-use light emitting device according to the present invention, taken along line 15-15 of FIG. 16.
Figure 16:
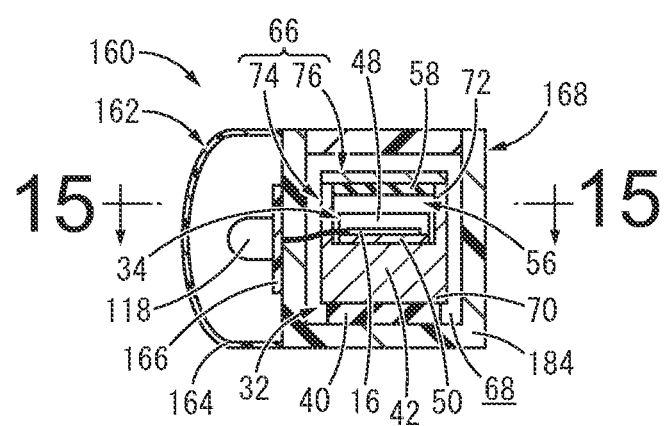
FIG. 16 is a cross sectional view taken along line 16-16 of FIG. 15.
Figure 17:
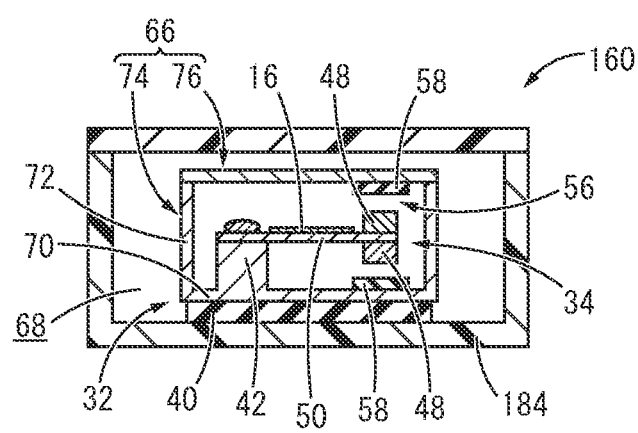
FIG. 17 is a cross sectional view taken along line 17-17 of FIG. 15.

Described more specifically, as depicted in FIGS. 15 through 17, the vehicle-use light emitting device 160 includes a bumper light 162 serving as an emitter and a vibration power generation device 168 serving as an operation power supply. The bumper light 162 is an accessory light that emit a light forward, and has a structure in which five LEDs 118 serving as light sources has their front surfaces covered by a light-transmissive cover 164 made of transparent or translucent synthetic resin. The five LEDs 118 are attached to a substrate 166 which includes an electrical circuit.

At the back of the LEDs 118, disposed is the vibration power generation device 168, which includes a box-shaped attachment member 184 that accommodates a first vibration system 32 and a second vibration system 34. The vibration power generation device 168 of the present embodiment is of a structure wherein the vibration power generation device 114 of the preceding embodiment shown in FIG. 14 is vertically inverted. Specifically, the first mass member 66 is constituted by a lower mass 74 of quadrangular tube shape with a bottom having a bottom wall 70 and a peripheral wall 72, and an upper mass 76 of plate shape covering the upper opening of the lower mass 74. Moreover, in the present embodiment as shown in FIG. 17, second mass members 48 are adhered to both upper and lower faces of one end of a plate spring 50, which is a distal end side thereof.

Then, the LEDs 118 are fixed to the attachment member 184, while the substrate 166 of the LEDs 118 and a power generating element 16 of the vibration power generation device 114 are electrically interconnected by a wiring harness 120.

As depicted in FIG. 13, the vehicle-use light emitting device 160 of the above construction is disposed in the bumper 122, and the light-transmissive cover 164 of the bumper light 162 is exposed to the front surface of the bumper 122. During driving of the automobile 111, the same as in the preceding embodiment related to the corner pole 112, vibration energy input to the vibration power generation device 168 is converted to electrical energy. By the obtained electric power being supplied to the LEDs 118, the bumper light 162 is configured to emit a light.

The vehicle-use light emitting device 160 according to the present embodiment is able to achieve the same effect as the vehicle-use light emitting device 110 in the preceding embodiment as well. That is, according to the present invention, the emitter of the vehicle-use light emitting device is not limited to the corner pole 112 but may be the bumper light 162.

Figure 18:
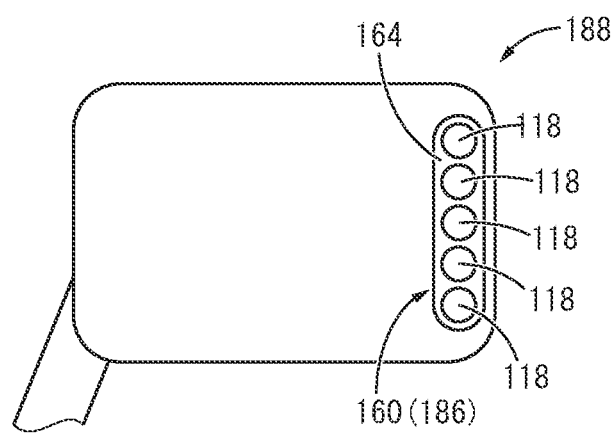
FIG. 18 is a front elevational view showing one mode of yet another embodiment of the vehicle-use light emitting device according to the present invention, wherein the light emitting device is disposed on a door mirror.
Figure 19:
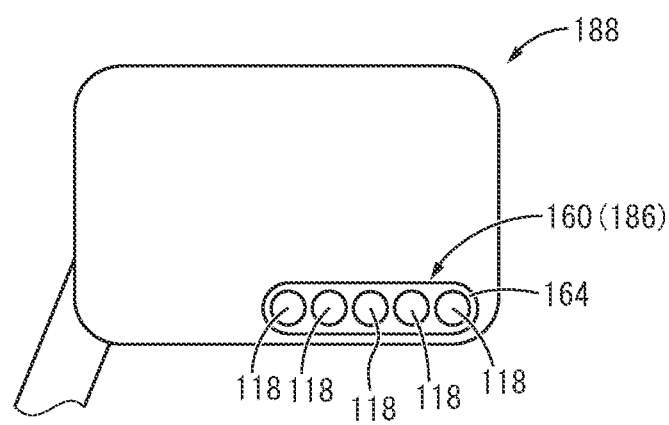
FIG. 19 is a front elevational view showing another mode wherein the light emitting device is disposed on the door mirror.

It would be also acceptable the emitter of the vehicle-use light emitting device 160 is a door mirror light 186. Specifically, as shown in FIG. 13, the vehicle-use light emitting device 160 is provided to a door mirror 188 of the automobile 111, and the door mirror light 186 is exposed to the front surface of the door mirror 188. The vibration power generation device 168 is embedded inside the door mirror 188 so as to provide an accessory light using the vehicle-use light emitting device 160. In this way, by providing the door mirror 188 in the vehicle-use light emitting device 160, it is possible to let the driver of the oncoming vehicle know the vehicle width, especially during night driving. In the case of providing the vehicle-use light emitting device 160 to the door mirror 188, no particular limitation is imposed as to the position of exposure of the door mirror light 186 in the front surface of the door mirror 188. However, as shown in FIGS. 18 and 19, it is desirable to provide the vehicle-use light emitting device 160 at the outer edge portion of the door mirror 188 in the vehicle width direction.

Figure 20:
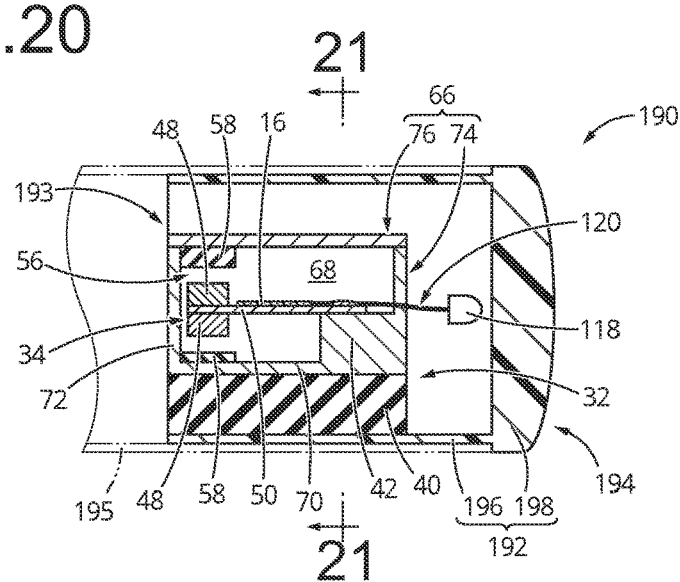
FIG. 20 is a cross sectional view showing one mode of still yet another embodiment of the vehicle-use light emitting device according to the present invention, wherein the light emitting device is disposed on a bar end, and taken along line 20-20 of FIG. 21.
Figure 21:
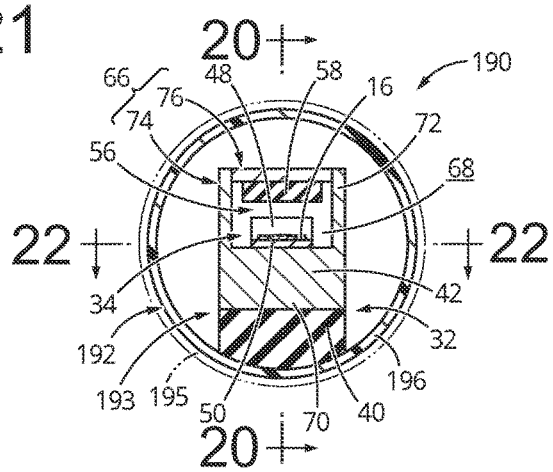
FIG. 21 is a cross sectional view taken along line 21-21 of FIG. 20.
Figure 22:
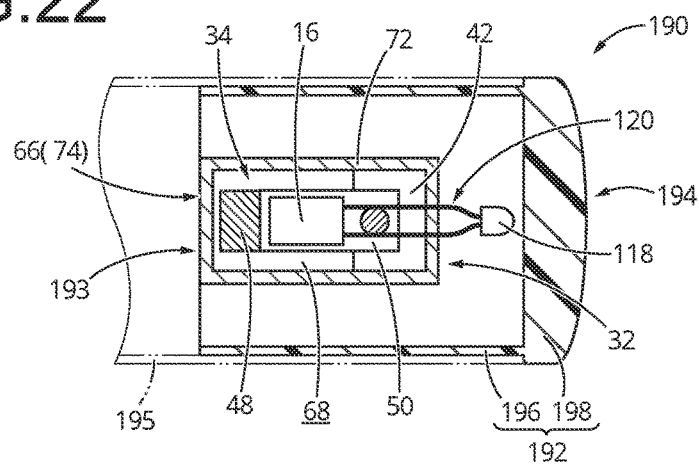
FIG. 22 is a cross sectional view taken along line 22-22 of FIG. 21.

FIGS. 20 through 22 depicts a vehicle-use light emitting device 190 as yet another embodiment of the present invention related to the vehicle-use light emitting device. The vehicle-use light emitting device 190 includes an end cap light 194 serving as an emitter in which an end cap 192 is arranged outside an LED 118 serving as a light source, and a vibration power generation device 193 housed in the end cap 192 and connected to the LED 118. The vibration power generation device 193 of the present embodiment has the same structure as the vibration power generation device 168 described in the preceding embodiment related to the vehicle-use light emitting device.

The end cap 192 is a component configured to attach to a handlebar end 195 serving as a vibrating member that constitutes the end of a bicycle, motorcycle, or the like. The end cap 192 has a laterally rotated, round tubular shape with a bottom overall, and includes a tubular portion 196 to be inserted into the handlebar end 195 and a transparent or translucent light-transmissive portion 198 provided so as to close off the outer opening of the tubular portion 196. In the present embodiment, the tubular portion 196 and the light-transmissive portion 198 are integrally formed. However, it would also be possible that the tubular portion 196 is made opaque due to two-color molding process, or the tubular portion 196 and the light-transmissive portion 198 formed as separate elements can be fixed later.

In the inner circumference area of the end cap 192, the LED 118 is disposed. The light emitted from the LED 118 is configured to be illuminated to outside via the light-transmissive portion 198 of the end cap 192, so as to constitute the end cap light 194 provided to the handlebar end 195 of the bicycle or the like.

Besides, the vibration power generation device 193 is disposed in the inner circumference area of the end cap 192 and its connecting rubber elastic body 40 is adhered to the tubular portion 196. Meanwhile, the LED 118 and a power generating element 16 of the vibration power generation device 193 are electrically connected by a wiring harness 120. Electric power obtained by the power generating element 16 is supplied to the LED 118 via the wiring harness 120, so that the LED 118 emits a light and the light of the LED 118 will go through the light-transmissive portion 198 in the axial direction of the end cap 192.

The vehicle-use light emitting device 190 constructed in the above manner is mounted onto the handlebar end 195 by the tubular portion 196 of the end cap 192 being inserted into the handlebar end 195 of the bicycle, so that the vibration power generation device 193 is housed within the handlebar end 195 while the end cap light 194 is exposed to the outer end face of the handlebar end 195. With this arrangement, vibration during driving of the bicycle allows the end cap light 194 to emit a light so as to make the position of the handlebar end 195, which constitutes each lateral end of the bicycle, easily visible. In preferred practice, the vehicle-use light emitting devices 190, 190 are respectively mounted onto the both lateral handlebar ends 195, 195 in order to make the vehicle width of the bicycle visually observable even during the night or the like.

While the vehicle-use light emitting device according to the present invention has been described in detail hereinabove in terms of the preferred embodiments, the invention is not limited by the specific disclosures thereof. For example, whereas the LED 118 is exemplified as the light source in the preceding embodiment, the light source is not limited in any particular way. Moreover, the number, placement, shape, size or the like of the light source should not be construed as limited in any way.

Also, in the structure of the present invention, since the light source and the vibration power generation device can be arranged closely to each other, the wiring (the wiring harness 120 of the present embodiment) may be omitted and a connection structure using a connector could instead be employed. This will avoid operation failure or the like due to disconnection of the wiring.

Besides, the vibrating member is not particularly limited as long as it is the end constituent component of a vehicle for which there is vibration input of an amount that is capable of power generation. In particular, the vibration power generation device of the vehicle-use light emitting device according to the present invention can be suitably used when the vibration levels of multiple types of vibration become maximum in mutually different vibration frequency ranges in the vibrating member. In specific terms, for example, with an automobile, a motorcycle, a bicycle or the like for which the vibration frequency changes according to the traveling state, dents and bumps in the road surface or the like, the end constituent component can become the vibrating member on which to mount the vibration power generation device.

In addition, as the vibrating member, other than the front bumper 122 and the door mirror 188 of the automobile 111 or the handlebar end 195 of the two-wheeled vehicle or the like illustrated in the preceding embodiments, possible examples are a rear bumper of the automobile, a front fork, a saddle, a mirror and a pedal of the two-wheeled vehicle (bicycle or motorcycle). In such cases, the emitter of the vehicle-use light emitting device would be a rear bumper light, a front position light, a rear position light, a mirror light (upper sidelight), and a pedal light (lower sidelight). Furthermore, in the preceding embodiments, the bumper 122 and the door mirror 188 to be attached to the main frame of the automobile 111 are exemplified as the vibrating member. However, the vibrating member may be constituted by a portion of the end of the main frame, for example.

Also, vehicles in which the present invention is to be implemented are not limited to automobiles, motorcycles, and bicycles, but may be, for example, rail vehicles, industrial vehicles, or the like.

Moreover, in the vehicle-use light emitting device of the present invention, various modes of the vibration power generation device can be employed other than the ones described in the preceding embodiments. It would also be acceptable for example to employ the vibration power generation devices 18, 64 respectively shown in FIGS. 3 and 12 of the embodiments related to the vehicle-use sensor device so as to provide the vehicle-use light emitting device.

Furthermore, with the vibration power generation device 114 shown in FIG. 14, the housing space 68 is formed by covering the opening part of the upper mass 76 with the lower mass 74, and the second vibration system 34 was housed inside this housing space 68, but the invention is not limited to this mode. Specifically, for example, it is also possible to have the upper mass be a roughly plate shape and for the lower mass to be a roughly tube shape with a bottom, or for the first mass member to be constituted from a tube shaped member that opens to the side and a member that covers this side opening part.

Figure 23:
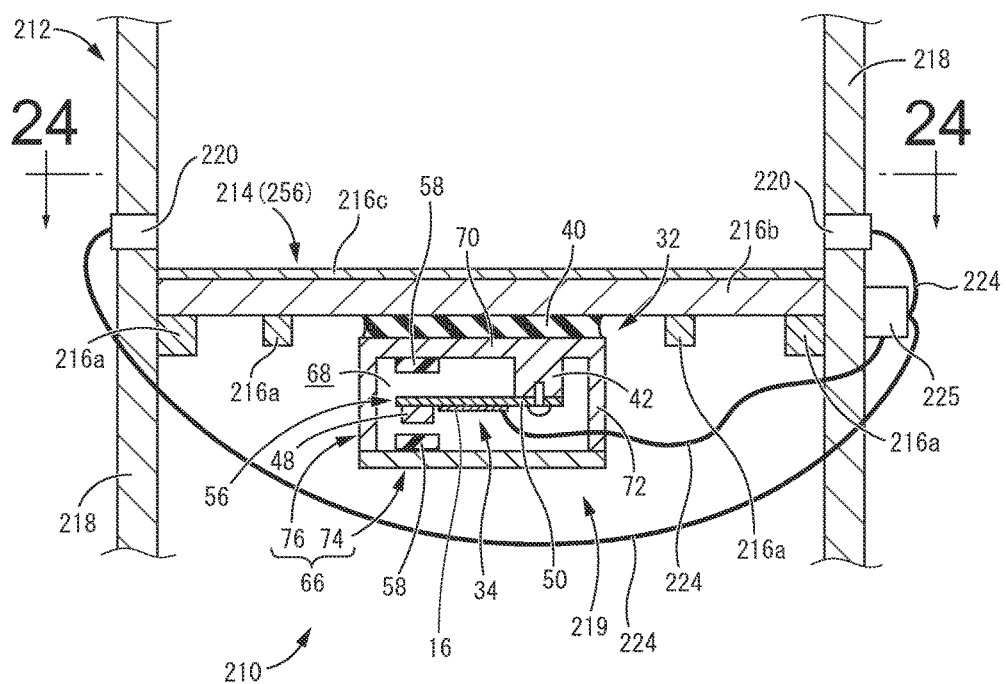
FIG. 23 is a vertical cross sectional view of one embodiment of a building-use light emitting device according to the present invention.
Figure 24:
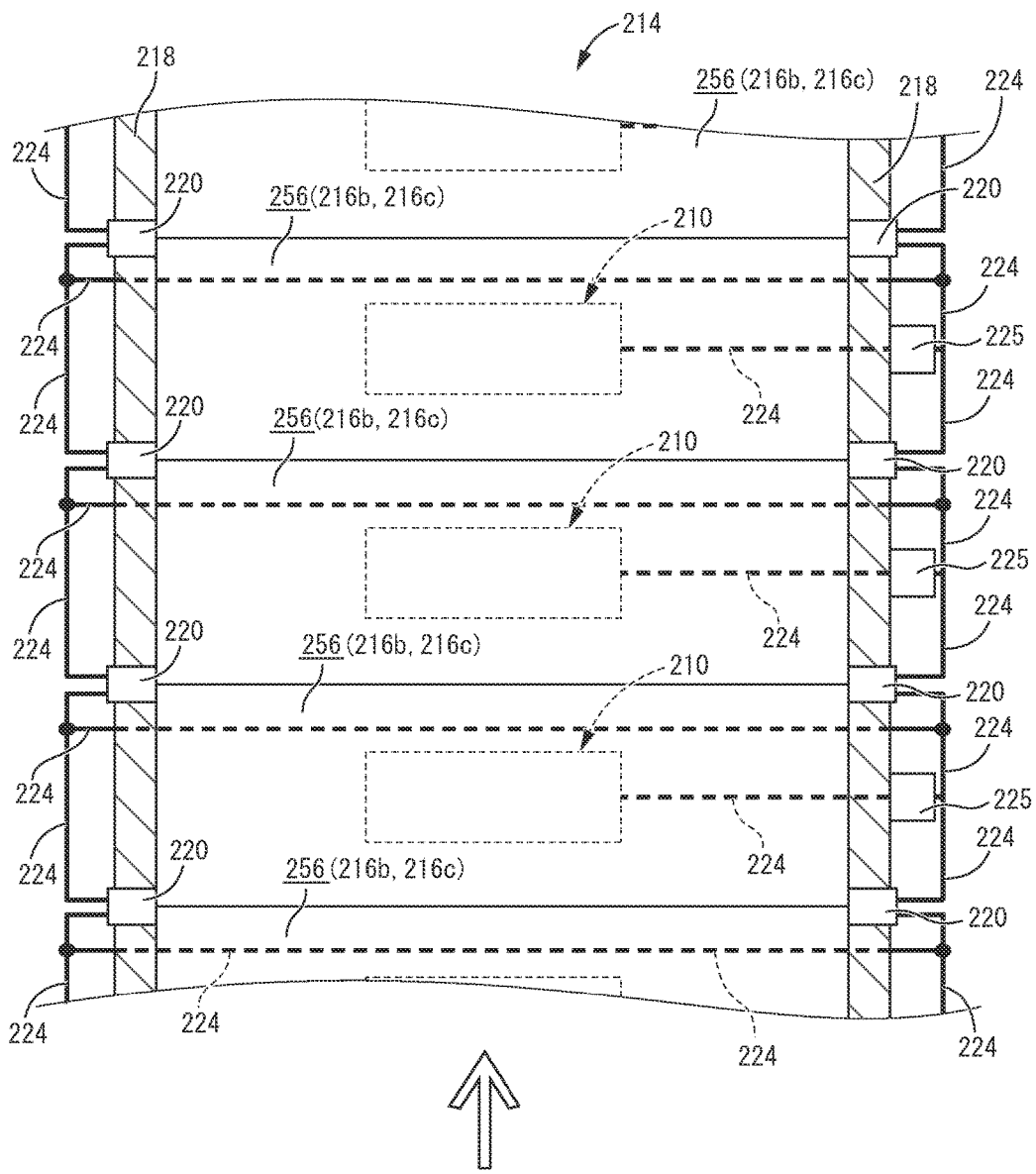
FIG. 24 is a cross sectional view taken along line 24-24 of FIG. 23.

Next, FIGS. 23 and 24 depict a building-use light emitting device 210 of construction according to the present invention. By being mounted onto a building 212, the building-use light emitting device 210 illuminates a walking region 214 in the building 212. In the description hereinbelow, as a general rule, the vertical direction refers to the vertical direction in FIG. 23, which coincides with the vertical direction.

Described more specifically, the building 212 can be built with a building structure of various known types, whose walking region 214 in the form of a corridor is illustrated in FIG. 23 in simplified form. The walking region 214 of the building 212 has a structure in which a floor base material 216b such as plywood is supported by a horizontal structural material 216a such as a girth, a floor beam, a joist or the like and laid so as to ensure sufficient floor loading capability, while a floor surfacing material 216c such as floor sheet, flooring or the like is affixed on the floor base material 216b.

Also, the walking region 214 constituted by the horizontal structural material 216a, the floor base material 216b, and the floor surfacing material 216c serving as a floor is configured such that people walk on its upper surface. Meanwhile, inner wall materials 218, 218 are formed projecting upright on both sides of the walking region 214. The inner wall materials 218 are attached and supported with a known building structure incorporating pillars, furring strips or the like, and their inner surfaces facing the walking region 214 are covered by a cloth or a coating film as needed.

The building-use light emitting device 210 which is mounted onto the building 212 described above and illuminates the walking region 214 comprises a vibration power generation device 219 attached to the floor and functioning as a vibration damper, and an LED 220 attached to the inner wall material 218 and serving as an emitter. By converting vibration energy of the floor that deforms and vibrates due to people walking on the walking region 214 to electrical energy using the vibration power generation device 219, the LED 220 is configured to emit a light. As will be apparent from the above description, in the present embodiment, the floor constituted by the horizontal structural material 216a, the floor base material 216b, and the floor surfacing material 216c serves as a vibrating member which is subjected to vibration deformation in mainly the vertical direction due to action of external load such as people's walking or earthquakes.

Here, as the LED 220, it is possible to employ any of those known in the art. The LED 220 is attached to the inner wall materials 218 on both sides of the walking region 214 and configured to illuminate the upper surface of the floor surfacing material 216c by light emission.

In the present embodiment, on a lead wire 224 through which electric power described later which is generated by the vibration power generation device 219 is supplied to each LED 220, a control device 225 is provided. The electric power from the vibration power generation device 219 is configured to be stabilized, turned into a constant voltage, or the like by the control device 225 and supplied to the LED 220. In preferred practice, the control device 225 includes, for example, a filter, an operational amplifier, a shunt regulator as well as a power storage circuit using a capacitor or the like.

Meanwhile, the vibration power generation device 219 mounted onto the floor has substantially the same structure as the vibration power generation device 62 of the preceding embodiment shown in FIG. 11. The vibration power generation device 219 includes a first vibration system 32 attached to the floor serving as the vibrating member, and a second vibration system 34 attached to the floor via the first vibration system 32. In other words, the first vibration system 32 and the second vibration system 34 are provided in series on the vibration transmission path from the floor, and the first vibration system 32 and the second vibration system 34 constitute a multiple-degree-of-freedom vibration system.

Furthermore, it is desirable to have the mass: $m_1$ of the first mass member 66 be 10% or greater of the equivalent mass: M of the floor ($m_1 \geq 0.1*M$). By doing this, the first mass member 66 has sufficient effect on the vibration state of the floor, and since it is possible to function as a dynamic damper, a vibration decrease of the floor can be expected by the vibration offset. In this way, the first vibration system 32 including the first mass member 66 and the connecting rubber elastic body 40 constitutes the vibration damper that suppresses vibration of the floor, namely the vibrating member.

Moreover, relative displacement of the second mass member 48 in relation to the first mass member 66 is allowed by elastic deformation (shear deformation) in the shearing direction which is the plate thickness direction of the plate spring 50 (vertical direction in FIG. 23). As is clear from this, the building-use light emitting device 210 is equipped with a two-degree-of-freedom vibration system constituted by the first vibration system 32 and the second vibration system 34. Vibrations of the floor are applied in the shearing direction of the plate spring 50 supported in a cantilever manner so as to generate bending deformation.

With the building-use light emitting device 210 constituted in this way, in the state mounted on the floor, the vibration energy of the floor is converted to electrical energy and extracted by the power generating element 16. In light of that, with the building-use light emitting device 210, by providing a two-degree-of-freedom vibration system and also arranging the power generating element 16 between the first and second mass members 66 and 48, efficient power generation is realized by the power generating element 16. Therefore, in the building-use light emitting device 210, the first vibration system 32 constitutes the vibration damper, while the vibration power generation device 219 includes the first vibration system 32 and the second vibration system 34.

Besides, the vibration power generation device 219 capable of exhibiting excellent power generating efficiency as described above constitutes the operation power supply for making the LED 220 as the emitter emit a light. In the present embodiment, the LED 220 is mounted onto the site different from the floor, namely the vibrating member. However, the LED may be mounted onto the floor to make the floor surface emit a light.

In addition, in the present embodiment, as depicted in FIG. 24, the walking region 214 in the form of the corridor is divided into a plurality of areas 256 strung in continuous fashion in the walking direction, and the building-use light emitting devices 210, the control devices 225 and LEDs 220 are mounted onto the respective areas 256 so as to be able to work separately. As a specific example, as shown in the drawing, for each single building-use light emitting device 210, four LEDs 220, 220, 220, 220 in total on opposite sides in the lengthwise direction (vertical direction in FIG. 24) as well as on opposite sides in the widthwise direction (lateral direction in FIG. 24) of the walking region 214, and the control device 225 electrically connected with the building-use light emitting device 210 are connected by the lead wires 224, 224, 224, 224.

With this arrangement, in the walking region 214, as the walker steps in the direction of the white arrow in FIG. 24, the vibration power generation device 219 to which the vibration is input sequentially shifts from the lower area 256 to the upper area 256 adjacent thereto in FIG. 24. Accordingly, by the walker passing within the lowermost area 256 and applying vibration to the building-use light emitting device 210 located in this area 256, the LEDs 220 connected to the building-use light emitting device 210 subjected to the vibration emit a light, so that the LEDs 220 emit sequentially starting from the lower ones to the upper ones in FIG. 24. That is, due to walking on the walking region 214, the foot light of the walking region 214 progressively moves at the substantially same speed as the walking by using the LEDs 220. Note that in the area 256 passed by the walker, as the vibrating force disappears and vibration of the second vibration system 34 of the vibration power generation device 219 converges, the LEDs 220 are sequentially turned out.

It should be appreciated that in the present embodiment, the LEDs 220, which is to be emitted through power supply from the vibration power generation device 219, are arranged on both front and back sides in the walking direction with respect to the site where each vibration power generation device 219 is mounted. Thus, even if people walk in the opposite direction of the white arrow in FIG. 24, the LEDs 220 of the walking region 214 sequentially emit a light in a similar way toward the walking direction.

It would also be acceptable to provide the control device 225 inside the housing space 68 so as to protect the circuit, control means, or the like.

With the building-use light emitting device 210 of the above construction, since the vibration power generation device 219 is attached to the lower surface of the floor serving as the vibrating member, vibration with a large amplitude due to the walking on the walking region 214 is input to the power generating element 16, thereby realizing more efficient power generation. In addition, with the vibration damper provided as well, the building-use light emitting device 210 is able to not only convert the vibration energy from the floor into the electrical energy but also reduce vibration of the floor.

Besides, since electric power can be obtained by the vibration power generation device 219 through walking on the walking region 214, the electricity is stably supplied to the LED 220 and enables the LED 220 to emit a light without needing labor such as a battery change, charging or the like. Moreover, in the absence of walking, no vibration is input to the vibration power generation device 219 and electric power supply to the LED 220 stops, so that the LED 220 automatically stops light emission. Thus, it is possible to automatically switch on and off of light emission of the LED 220 without any operation.

Furthermore, in the present embodiment, because one's feet can be illuminated by walking on the walking region 214, there is no need to turn on any separate lighting source, thereby being capable of reliably making people recognize the walking region 214 and assisting their walking even in the darkness. In particular, even in the case where the external power supply is out of working order over a long period such as during a power outage due to earthquakes, the walking region 214 can stably be illuminated. Thus, it is possible to employ the building-use light emitting device 210 as an evacuation light as well. Moreover, even during the disaster due to earthquakes or the like, since the building-use light emitting device 210 is provided inside the building 212, risk of damage thereto can be reduced, thereby allowing the walking region 214 to be illuminated.

Additionally, the walking region 214 is divided into the plurality of areas 256, and the building-use light emitting device 210 and the LEDs 220 are separately arranged to every area 256. Therefore, even if equipment in some areas 256 gets damaged, there is an advantage of ensuring illumination function of the walking region 214 owing to equipment of other areas 256.

In addition, in the present embodiment as well, on the basis of the vibration power generation device having the employed specific construction, all of the technical effects the same as in the aforementioned vehicle-use sensor device or the vehicle-use light emitting device can effectively be exhibited.

Figure 25:
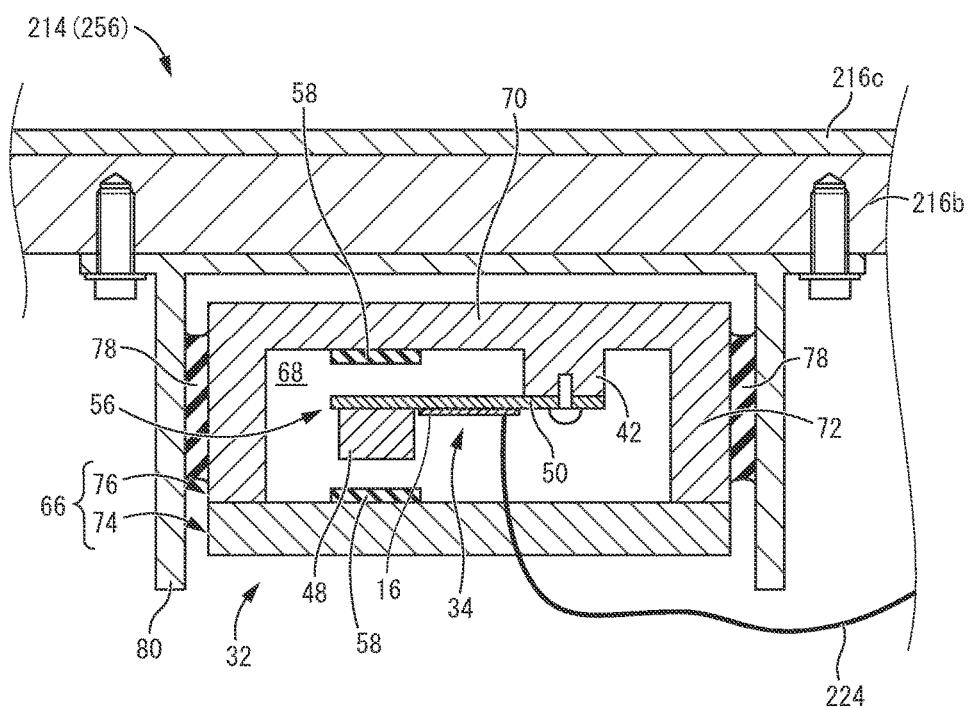
FIG. 25 is a vertical cross sectional view of another mode of the building-use light emitting device according to the present invention.
Figure 26:
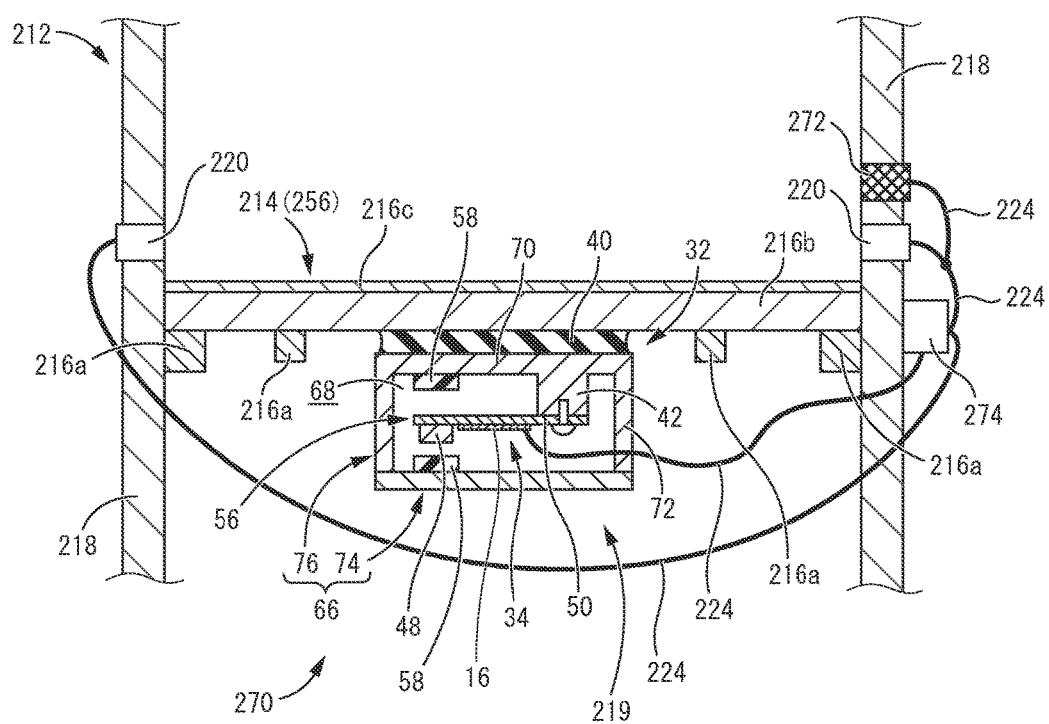
FIG. 26 is a vertical cross sectional view of yet another mode of the building-use light emitting device according to the present invention.

Also, in the building-use light emitting device as well, the present invention is not limited by the specific disclosures of the preceding embodiment. For example, the vibration power generation device of the building-use light emitting device according to the present invention may employ various modes as shown in FIGS. 25 and 26 other than the one in the preceding embodiment. In FIGS. 25 and 26, elements like those in the preceding embodiment, such as LEDs or the like, shall be omitted from the drawing or designated by like reference numerals and will not be discussed in detail.

Specifically, the vibration power generation device depicted in FIG. 25, in a substantially similar way to the vibration power generation device of the preceding embodiment related to the vehicle-use sensor device depicted in FIG. 12, includes a first mass member 66 having a hollow structure, and a second vibration system 34 housed within a housing space 68 of the first mass member 66.

Meanwhile, the first mass member 66 is elastically connected to a floor serving as a vibrating member indirectly by a first spring member 78 which is provided on the outer circumference surface of a peripheral wall 72 of the first mass member 66.

With the vibration power generation device constituted in this way, since the first spring member 78 of the first vibration system 32 mainly undergoes shear deformation in the main vibration input direction by vibration from the floor, it is possible to do low dynamic spring tuning, and to have an improvement in the degree of freedom of the characteristics tuning.

Furthermore, a building-use light emitting device 270 shown in FIG. 26 includes a speaker 272 serving as a sound device. The speaker 272 is provided, for example, to the side wall, the ceiling or the like, and electrically connected through a lead wire 224 to a control device 274 which is electrically connected to the building-use light emitting device 270. By using electric power obtained through input of vibration to a vibration power generation device 219 of the building-use light emitting device 270, the speaker 272 will issue a prescribed sound. The speaker 272, for example, includes an amplifier and a memory device of a warning sound embedded therein. When a warning signal is input from the control device 274, the amplifier operates by using the electric power supplied from the vibration power generation device 219 through the control device 274, and then the prescribed warning sound stored in the memory device will be issued. The sound to be issued from the speaker 272 may be music, alarm, or messages and the like.

In this way, owing to the speaker 272 provided to the building-use light emitting device 270, not only a light is emitted from the LED 220 but also a sound is issued from the speaker 272 by walking on the walking region 214. With this arrangement, even in the case where the walker is a blind person or an elderly person with impaired vision who finds it difficult to clearly recognize the floor surface of the walking region 214 visually, it is possible to improve the extent of recognition of the walking region 214 by making use of support by the auditory sense.

Also, the electrical circuit may include a detecting device that monitors input of vibration to the vibration power generation device and generates a detection signal, and a transmission device that transmits the detection signal by wire or wirelessly to outside. By so doing, input of vibration to the vibration power generation device can rapidly be notified to, for example, the owner or the administrator of the building, the police, or security. In particular, by transmitting the detection signal to a mobile terminal, a mobile phone or the like, it is possible to know input of vibration to the vibration power generation device even in remote locations from the building.

Providing the above-described function to the building-use light emitting device also makes it possible to constitute a simple security device utilizing power generation function of the building-use light emitting device. In particular, since the operation power supply of the security device is constituted by the vibration power generation device of the building-use light emitting device, no external power supply is required. Therefore, even in the case where the external power supply is out of working order due to power outage, breaking of wire or the like, electric power is covered by the vibration power generation device, thereby realizing an enhanced security device. Moreover, by employing the above-described function together with the speaker 272 mentioned above and allowing a large alarm and a light of the LED 220 to be emitted, more enhanced security device is realized.

Whereas the LED 220 is exemplified as the emitter in the preceding embodiments, no particular limitation is imposed as to the emitter. Besides, the number, placement, shape, size or the like of the emitter should not be construed as limited in any way.

Furthermore, the vibration power generation device of the building-use light emitting device according to the present invention can be suitably used when the vibration levels of multiple types of vibration become maximum in mutually different vibration frequency ranges in the vibrating member. In specific terms, for example, the walking region of the building for which the vibration frequency changes according to the area of the floor board or the weight of the people serves as the vibrating member. Then, the identical building-use light emitting device is preferably mounted on the position by which vibrations input from the vibrating member are applied to the multiple-degree-of-freedom vibration system of the vibration power generation device. While the corridor was exemplified as the walking region in the preceding embodiment, the walking region may alternatively be any places such as a stairway, a kitchen, an entrance or the like, for example.

In particular, in the present invention related to the building-use light emitting device as well, various changed modes similar to those in the preceding embodiments related to the sensor device or the vehicle-use light emitting device can be employed. It is to be understood that such modes are all within a range of the present invention as long as they do not deviate from the intention thereof.

Additionally, in the preceding embodiments, the LEDs 220 were provided to the lower end portion of the opposite inner wall materials 218, 218 in the walking region 214. However, the LEDs 220 are not limited to such modes but may be provided to the upper end portion or vertically middle portion of the opposite inner wall materials 218, 218. Alternatively, the LEDs could be provided at positions away from the building-use light emitting device in the floor surface or the ceiling of the walking region 214.

Moreover, whereas the walking region 214 was divided into the plurality of continuous areas 256 in the preceding embodiments, the areas 256 need not be in continuous fashion. Specifically, if the building-use light emitting device according to the present invention is located in the walking region such as a stairway, only treads of the stairway may be the areas for locating the building-use light emitting device. It would also be acceptable to provide the building-use light emitting device to the walking regions separated from one another in a stepping-stone form, or to the positions separated by a prescribed distance in the continuous walking region.

What is claimed is:

1. A vibration power generation device comprising:
   a power generating element configured to be attached to a vibrating member to convert vibration energy of the vibrating member to electrical energy; and
   a multiple-degree-of-freedom vibration system including:
   (i) a first vibration system in which a first mass member is elastically supported by a first spring member, the first spring member being formed of a rubber elastic body arranged between opposing faces of the first mass member and an attachment member attached to the vibrating member, the first mass member and the attachment member facing each other in a direction orthogonal to a main vibration input direction, and (ii) a second vibration system in which a second mass member is elastically connected to the first mass member by a second spring member, wherein:
   the power generating element is arranged between the first mass member and the second mass member, and relative displacement of the first mass member and the second mass member is caused by vibration being applied from the vibrating member to the first mass member and transmitted to the second mass member so that the vibration energy of the vibrating member is input to the power generating element,
   a natural frequency of the first vibration system is different from a natural frequency of the second vibration system,
   the first mass member has a hollow structure provided with a housing space inside, and the second vibration system is housed within the housing space,
   the second spring member of the second vibration system is formed of a plate spring, and the power generating element is mounted on the plate spring,
   a support part projects within the housing space of the first mass member in the main vibration input direction from one of at least two peripheral walls of an interior of the hollow structure, the at least two peripheral walls extending in the direction orthogonal to the main vibration input direction and facing each other in the main vibration input direction,
   one end side of the plate spring is attached to the support part and supported within the housing space at a position inward from a peripheral wall of the first mass member, and
   the second mass member is attached to another end side of the plate spring.

2. The vibration power generation device according to claim 1, wherein a center of gravity of the first mass member is set within the housing space.

3. The vibration power generation device according to claim 1, wherein the natural frequency of the second vibration system is set to a lower frequency in relation to the natural frequency of the first vibration system.

4. The vibration power generation device according to claim 1, wherein the natural frequency of the first vibration system is set to a higher frequency than an electrical antiresonance frequency of the second vibration system.

5. The vibration power generation device according to claim 1, wherein the natural frequency of the first vibration system is $\sqrt{2}$ times or less in relation to the natural frequency of the second vibration system.

6. The vibration power generation device according to claim 1, wherein a resonance response magnification of the second vibration system is made larger than a resonance response magnification of the first vibration system, and a product of a mass of the first mass member and the resonance response magnification of the first vibration system is larger than a product of a mass of the second mass member and the resonance response magnification of the second vibration system.

7. The vibration power generation device according to claim 1, further comprising a stopper that restricts the relative displacement of the second mass member in relation to the first mass member.

8. The vibration power generation device according to claim 1, wherein the device is configured to be mounted on a site of the vibrating member by which vibrations of multiple types whose vibration levels become maximum within mutually different frequency ranges are applied to the multiple-degree-of-freedom vibration system.

9. The vibration power generation device according to claim 1, wherein a mass of the first mass member is 10% or greater of an equivalent mass of the vibrating member.

10. The vibration power generation device according to claim 1, further comprising a transmitter that transmits an output state of the power generating element to an outside.

11. The vibration power generation device according to claim 10, wherein the transmitter comprises a wireless transmission device, and the output state of the power generating element is configured to be wirelessly transmitted to the outside by the wireless transmission device being operated using electric power obtained by input of vibration energy into the power generating element.

12. A sensor device comprising:
    a sensing element; and
    the vibration power generation device as defined in claim 1, wherein
    electric power obtained by the vibration power generation device is configured to be self-supplied.

13. The sensor device according to claim 12, wherein the vibration power generation device is an operation power supply for sensing by the sensing element.

14. The sensor device according to claim 12, further comprising a wireless transmission device that transmits a detection signal from the sensing element, wherein the vibration power generation device is an operation power supply for the wireless transmission device.

15. The sensor device according to claim 12, further comprising a signal processing device that processes a detection signal from the sensing element, wherein the vibration power generation device is an operation power supply for the signal processing device.

16. The sensor device according to claim 12, wherein the sensing element comprises the power generating element.

17. The sensor device according to claim 12, further comprising a warning device that gives an alarm depending on power generation condition of the vibration power generation device.

18. A vehicle-use light emitting device that is provided to a vehicle member constituting an end of a vehicle, the vehicle-use light emitting device comprising:
an emitter to emit a light through power supply; and
the vibration power generation device as defined in claim 1, wherein
electric power obtained by the vibration power generation device is configured to be self-supplied.

19. The vehicle-use light emitting device according to claim 18, wherein the vehicle member comprises an automotive member constituting an end of an automobile serving as the vehicle, and the emitter comprises at least one of a corner pole, a door mirror light and a bumper light.

20. The vehicle-use light emitting device according to claim 18, wherein the vehicle member comprises a two-wheeled-vehicle member constituting an end of a two-wheeled vehicle serving as the vehicle, and the emitter comprises at least one of an end cap light of handlebars, a rear position light at a back of a seat, a front position light of a front fork, and a mirror light.

21. The vehicle-use light emitting device according to claim 18, wherein the vibrating member is a separate component attached to a main frame of the vehicle.

22. A building-use light emitting device comprising:
an emitter that lightens a walking region of a building; and
the vibration power generation device as defined in claim 1, wherein
a vibration damper is constituted by the first vibration system in which the first mass member is elastically supported by the first spring member with respect to a floor of the walking region of the building, and
electric power obtained by the vibration power generation device is configured to be self-supplied.

23. The building-use light emitting device according to claim 22, wherein the walking region of the building is set to at least one of a stairway and a corridor.

24. The building-use light emitting device according to claim 22, wherein the walking region of the building comprises a plurality of areas, and electrical circuits are provided separately to the areas, the electrical circuits each turning on the emitter using electric power obtained by the power generating element provided to the multiple-degree-of-freedom vibration system.

25. The building-use light emitting device according to claim 22, further comprising a sound device, wherein the sound device is configured to ring using electric power obtained by input of vibration energy into the power generating element.

* * * * *